(12) United States Patent
Yossef

(10) Patent No.: US 9,581,636 B2
(45) Date of Patent: Feb. 28, 2017

(54) CABLING SYSTEM AND METHOD FOR MONITORING AND MANAGING PHYSICALLY CONNECTED DEVICES OVER A DATA NETWORK

(71) Applicant: HCS KABLOLAMA SISTEMLERI SANAYI VE TICARET A.S., Esenler-Istanbul (TR)

(72) Inventor: Shay Yossef, Moshav Maor (IL)

(73) Assignee: HCS KABLOLAMA SISTEMLERI SANAYI VE TICARET A.S., Esenler-Istanbul (TR)

( * ) Notice: Subject to any disclaimer, the term of this patent is extended or adjusted under 35 U.S.C. 154(b) by 418 days.

(21) Appl. No.: 14/173,889

(22) Filed: Feb. 6, 2014

(65) Prior Publication Data
US 2014/0184238 A1 Jul. 3, 2014

Related U.S. Application Data

(62) Division of application No. 12/687,162, filed on Jan. 14, 2010, now abandoned.
(Continued)

(51) Int. Cl.
*G08B 29/00* (2006.01)
*G01R 31/04* (2006.01)
(Continued)

(52) U.S. Cl.
CPC ........ *G01R 31/043* (2013.01); *H04L 12/2602* (2013.01); *H04L 43/00* (2013.01); *H04Q 1/136* (2013.01); *H04B 3/46* (2013.01)

(58) Field of Classification Search
CPC .... G01R 31/02; G01R 31/3187; G01R 31/11; G01R 31/08
(Continued)

(56) References Cited

U.S. PATENT DOCUMENTS 3,986,106 A * 10/1976 Shuck ................. G01R 31/023
324/538
4,953,194 A * 8/1990 Hansen .................. H04L 41/12
324/66
(Continued)

FOREIGN PATENT DOCUMENTS

EP 1796403 A2 6/2007
RU 2310210 A1 11/2007

OTHER PUBLICATIONS

International Application PCT/IL2012/050140 Search report dated Oct. 9, 2012.
(Continued)

*Primary Examiner* — Hoi Lau
(74) *Attorney, Agent, or Firm* — D.Kliger IP Services Ltd.

(57) ABSTRACT

The present disclosure relates to a method and system configured to monitor devices that are physically connected over a data network, said system comprising at least one scanner configured to monitor said data network and to determine devices that are physically connected over said data network, said at least one scanner being connected to at least one panel over said data network, wherein at least one terminal of each panel is connected to an electronic circuitry, which comprises one or more electronic components, for enabling said at least one scanner to determine changes in one of voltage or current level over at least one of said one or more electronic components, said changes occurring due to connecting or disconnecting devices over said data network, thereby enabling said at least one scanner to monitor devices that are physically connected over said data network.

16 Claims, 20 Drawing Sheets

Related U.S. Application Data

(60) Provisional application No. 61/144,905, filed on Jan. 15, 2009.

(51) Int. Cl.
  *H04L 12/26* (2006.01)
  *H04Q 1/02* (2006.01)
  *H04B 3/46* (2015.01)

(58) Field of Classification Search
  USPC ............ 340/815.45, 514; 709/224; 327/518; 702/1; 439/119, 49; 324/527, 66, 646, 324/76.19, 539; 379/25, 22.02, 22.03
  See application file for complete search history.

(56) References Cited

U.S. PATENT DOCUMENTS

| | | | |
|---|---|---|---|
| 5,107,532 A * | 4/1992 | Hansen | H04L 41/12 324/66 |
| 5,483,467 A | 1/1996 | Krupka et al. | |
| 5,523,747 A | 6/1996 | Wise | |
| 5,677,633 A * | 10/1997 | Moser | G01R 31/021 324/539 |
| 5,731,755 A | 3/1998 | Boxer | |
| 5,864,602 A * | 1/1999 | Needle | G01R 31/021 324/519 |
| 5,978,449 A * | 11/1999 | Needle | G01R 31/021 324/519 |
| 6,079,259 A * | 6/2000 | Starman | F02D 41/20 73/114.45 |
| 6,198,292 B1 * | 3/2001 | Kirk | H04B 3/487 324/607 |
| 6,218,930 B1 * | 4/2001 | Katzenberg | 340/12.32 |
| 6,259,258 B1 * | 7/2001 | Cook | H04B 3/487 324/539 |
| 6,356,532 B1 | 3/2002 | Richardson et al. | |
| 6,590,374 B1 | 7/2003 | Har Lev | |
| 6,750,643 B2 * | 6/2004 | Hwang | G01R 31/041 324/66 |
| 6,961,675 B2 | 11/2005 | David | |
| 7,002,353 B1 * | 2/2006 | Lo | H04L 1/248 324/533 |
| 7,057,899 B2 | 6/2006 | Abughazaleh et al. | |
| 7,081,764 B1 * | 7/2006 | Pandya | H04B 3/487 324/539 |
| 7,271,575 B2 * | 9/2007 | Pickerd | G01R 13/22 324/642 |
| 7,336,061 B2 * | 2/2008 | Ku | G01R 31/023 324/542 |
| 7,409,294 B2 | 8/2008 | Mead et al. | |
| 7,672,782 B2 | 3/2010 | Mead et al. | |
| 8,970,237 B2 * | 3/2015 | Martin | G06F 13/4247 324/519 |
| 2002/0062189 A1 | 5/2002 | Kannonji | |
| 2002/0076950 A1 | 6/2002 | Frostorm et al. | |
| 2002/0105344 A1 * | 8/2002 | Bohley | G01B 7/02 324/662 |
| 2002/0151201 A1 | 10/2002 | Bohbot | |
| 2003/0026009 A1 | 2/2003 | Vandenbrink | |
| 2003/0159609 A1 | 8/2003 | Rauscher | |
| 2004/0021452 A1 * | 2/2004 | Hwang | G01R 31/041 324/66 |
| 2004/0027138 A1 * | 2/2004 | Pickerd | G01R 13/22 324/646 |
| 2004/0066202 A1 * | 4/2004 | Pereira | G01R 31/021 324/539 |
| 2004/0101133 A1 | 5/2004 | Le et al. | |
| 2004/0220736 A1 | 11/2004 | Wallace et al. | |
| 2005/0090982 A1 | 4/2005 | Mead et al. | |
| 2005/0111063 A1 | 5/2005 | Shar et al. | |
| 2005/0156757 A1 | 7/2005 | Garner | |
| 2005/0179533 A1 | 8/2005 | Stevenson | |
| 2005/0187701 A1 | 8/2005 | Baney | |
| 2005/0242825 A1 * | 11/2005 | Bottman | H04B 3/487 324/539 |
| 2005/0258818 A1 * | 11/2005 | West | G01R 31/3172 324/762.02 |
| 2005/0259033 A1 | 11/2005 | Levine | |
| 2005/0264299 A1 * | 12/2005 | Manani | H04B 3/56 324/539 |
| 2006/0063406 A1 | 3/2006 | Shifris et al. | |
| 2006/0094291 A1 | 5/2006 | Caveney et al. | |
| 2006/0128212 A1 | 6/2006 | Carrick | |
| 2006/0181433 A1 | 8/2006 | Wolterman | |
| 2006/0181449 A1 | 8/2006 | Aker | |
| 2006/0256540 A1 | 11/2006 | Abughazaleh et al. | |
| 2007/0030014 A1 * | 2/2007 | Pandya | H04B 3/487 324/626 |
| 2007/0132503 A1 * | 6/2007 | Nordin | H04Q 1/136 327/518 |
| 2007/0132573 A1 | 6/2007 | Quach et al. | |
| 2007/0206749 A1 | 9/2007 | Pincu et al. | |
| 2007/0241757 A1 * | 10/2007 | Ku | G01R 31/023 324/527 |
| 2007/0276600 A1 | 11/2007 | King et al. | |
| 2008/0045075 A1 | 2/2008 | Caveney et al. | |
| 2008/0082594 A1 | 4/2008 | Soltes et al. | |
| 2008/0141056 A1 | 6/2008 | Abughazaleh et al. | |
| 2008/0168283 A1 | 7/2008 | Penning | |
| 2008/0174453 A1 | 7/2008 | Schofield | |
| 2008/0253556 A1 | 10/2008 | Cobb et al. | |
| 2008/0320541 A1 | 12/2008 | Zinevich | |
| 2009/0055666 A1 | 2/2009 | Yee | |
| 2009/0177769 A1 | 7/2009 | Roberts | |
| 2010/0008482 A1 | 1/2010 | Tucker | |
| 2010/0033174 A1 | 2/2010 | Gleich et al. | |
| 2010/0117864 A1 | 5/2010 | Makukhin | |
| 2010/0159742 A1 | 6/2010 | Chen | |
| 2010/0176962 A1 * | 7/2010 | Yossef | H04L 12/2602 340/815.45 |
| 2010/0214126 A1 | 8/2010 | Publicover | |
| 2011/0112720 A1 | 5/2011 | Keep et al. | |
| 2011/0128136 A1 | 6/2011 | Katoh et al. | |
| 2011/0258839 A1 | 10/2011 | Probst | |
| 2011/0298603 A1 | 12/2011 | King et al. | |
| 2014/0043043 A1 | 2/2014 | Yossef | |

OTHER PUBLICATIONS

U.S. Appl. No. 12/687,162 Office Action dated Feb. 14, 2013.
International Application PCT/IB2014/058680 Search Report dated May 20, 2014.

* cited by examiner

CABLING SYSTEM AND METHOD FOR MONITORING AND MANAGING PHYSICALLY CONNECTED DEVICES OVER A DATA NETWORK

CROSS-REFERENCE TO RELATED APPLICATION

This application claims the benefit of priority from U.S. Provisional Patent Application No. 61/144,905, filed on Jan. 15, 2009

FIELD OF THE INVENTION

The present invention relates to cabling systems. More particularly, the present invention relates to an improved cable management system and a method thereof, which enables monitoring and managing physically connected network nodes/devices (and patching between said devices), regardless of whether they are passive or active (e.g., switched OFF and switched ON network devices, respectively) over a local data network, such as the LAN (Local Area Network), Ethernet, and the like.

DEFINITIONS, ACRONYMS AND ABBREVIATIONS

Throughout this specification, the following definitions are employed:

Cross-Connect Panel: a cross-connect (CC) panel is a device that is connected to at least one network switch for interconnecting it with one or more patch panels.

Differential Mode/Signaling: is a method of transmitting information electrically by means of two complementary signals conveyed on two separate wires. This technique can be used for analog and digital signaling, based on conventional standards, such as RS-422 (Recommended Standard 422), RS-485, Ethernet (twisted pair), PCI Express, USB, etc. The opposite technique is called single-ended mode/signaling, based for example on the conventional RS-232 standard.

Keystone Jack: a keystone jack (KJ) is a connector used in data communication networks, such as in local area networks, Ethernet, etc.

Layer 1/Physical Layer: is the first level in the seven-layer OSI (Open Systems Interconnection) model of computer networking. It translates communications requests from the Data Link Layer into hardware-specific operations, and vice-versa, to effect transmission or reception of electronic signals. The Physical Layer is a fundamental layer upon which all higher level functions in a network are based.

Network Switch: is a networking device that connects segments of a data network, such as the Ethernet, a LAN and the like. Generally, when using a network switch, so called "micro-segmentation" of data is utilized for providing bandwidth on point-to-point connections with each network remote node, thus enabling operating over the network substantially without data collisions.

Patch Cord: a patch cord or patch cable is an electrical or optical cable, used to connect (or to patch-in) one electronic or optical device to another. The patch cord may carry various signals, such as data signals, audio signals, video signals, television signals, and the like.

Patch Panel: a patch panel (PP) is a device that provides network cable connections and enables routing of signals (e.g., electrical or optical signals).

BACKGROUND OF THE INVENTION

In the last decade, computer/telecommunication networks have dramatically expanded and often include hundreds of interconnections between various network units (devices), wherein the interconnections, in turn, usually include cabling that enables connecting the network devices together. However, man aging and monitoring such cabling has become significantly complicated due to the large volume of cables (e.g., patch cords) that interconnect the plurality of network devices.

As a result, there is a need in the art to provide a cable management system over a local data network (such as a LAN), wherein connections between various network devices can be efficiently managed and monitored by means of this cable management system to allow significantly easier control of a plurality of network cables. A problem has been recognized in the prior art, and various systems have been developed to provide a solution. For example, U.S. Pat. No. 6,961,675 enables monitoring the connection pattern of data ports, which are connected by multi-conductor cables, without requiring special patch cables or patch panels. An adapter jacket having an external contact is placed over a standardized cable such as an RJ45 cable which connects the data ports. An adapter board having a plurality of socket contacts is placed adjacent to a plurality of data ports. Output and input modules are coupled to the socket contacts. A micro-processor, which is coupled to the output and input modules, scans the socket contacts to determine the connection pattern of the data ports.

U.S. Patent No. 2008/0045075 presents a method and apparatus for monitoring and reporting cable connectivity, such as patch panel port-level connectivity on a real-time basis. For patch panel systems, this system is based upon a distributed architecture that may be modularly scalable and may reduce, if not eliminate, the need for a centralized signal processor and complex cabling between patch panels and the centralized signal processor.

U.S. Pat. No. 5,483,467 discloses a local area network, including cabling interconnecting a plurality of workstations, having a plurality of data ports and conductors for selectable and removable interconnection between selected ones of the data ports, and apparatus for automatically providing an indication of the connection pattern of the data ports.

There is a need in the art to provide a cable management method and system, which enables monitoring and managing physically connected units or devices on the physical layer (OSI Layer 1) over a local data network, such as a LAN, and the like. In addition, there is a need in the art to enable monitoring active (e.g., switched ON) and passive (e.g., switched OFF) network devices, which are connected to a local data network by means of network outlets over a conventional cabling infrastructure (e.g., RJ45 (Registered Jack 45), RJ11 cabling) without the need to use dedicated cables, plugs, sockets or connectors. Further, there is a need to provide a cabling method and system, which is user friendly and enables relatively simple and efficient monitoring and management of the local data network.

SUMMARY OF THE INVENTION

The present invention relates to an improved cable management system and a method thereof, which enables monitoring and managing physically connected network nodes/devices (and patching between said devices), regardless of whether they are passive or active (e.g., switched OFF and switched ON network devices, respectively) over a local data network, such as the LAN (Local Area Network), Ethernet, and the like.

A system is configured to monitor devices that are physically connected over a data network, said system comprising at least one scanner configured to monitor said data network and to determine devices that are physically connected over said data network, said at least one scanner being connected to at least one panel over said data network, wherein at least one terminal of each panel is connected to an electronic circuitry, which comprises one or more electronic components, for enabling said at least one scanner to determine changes in one of voltage or current level over at least one of said one or more electronic components, said changes occurring due to connecting or disconnecting devices over said data network, thereby enabling said at least one scanner to monitor devices that are physically connected over said data network.

According to an embodiment of the present invention, the panel is one of the following:
a) a patch panel; and
b) a cross-connect panel.

According to another embodiment of the present invention, the patch panel is substantially identical to the cross-connect panel.

According to still another embodiment of the present invention, the monitoring is performed substantially in real-time.

According to still another embodiment of the present invention, the scanner comprises an Input/Output (I/O) Interface for communicating with the at least one panel.

According to still another embodiment of the present invention, the I/O Interface comprises a plurality of I/O ports for enabling connecting the at least one panel to the scanner.

According to still another embodiment of the present invention, the I/O Interface comprises a plurality of transceivers for enabling receiving and transmitting data.

According to a further embodiment of the present invention, the scanner comprises a scan-mode activation unit for activating at least one scan-mode.

According to still a further embodiment of the present invention, the scan-mode activation unit comprises at least one switch for enabling switching from one scan-mode to another.

According to still a further embodiment of the present invention, the scan-mode is selected from at least one of the following:
a) a patching scan-mode;
b) an impedance scan-mode;
c) an inductance scan-mode;
d) a capacitance scan-mode; and
e) a port detecting scan-mode.

According to an embodiment of the present invention, the scanner further comprises a sensing unit for determining the changes in one of the voltage or current level.

According to another embodiment of the present invention, the scanner comprises a microcontroller configured to perform at least one of the following:
a) control operation of a sensing unit of the scanner, said sensing unit enabling determining the changes in one of the voltage or current level;
b) select at least one corresponding panel port;
c) receive and process scan results from the scanner; and
d) convey the scan results to a server.

According to still another embodiment of the present invention, the scanner comprises a processing unit configured to perform at least one of the following:

a) control operation of the scanner;
b) send and receive instructions related to devices connected over the data network; and
c) manage execution of at least one work order, which is provided from a server.

According to still another embodiment of the present invention, the scanner comprises a programmable memory means.

According to still another embodiment of the present invention, the electronic circuitry is at least partially integrated into at least one of the following:
a) the patch panel;
b) the cross-connect panel; and
c) the scanner.

According to an embodiment of the present invention, the device is a passive device, thereby a switched OFF device.

According to another embodiment of the present invention, the device is an active device, thereby a switched ON device.

According to an embodiment of the present invention, each panel comprises a microcontroller and/or processing unit configured to control operation of said each panel and of at least one unit of said each panel.

According to another embodiment of the present invention, the panel comprises a programmable memory means.

According to still another embodiment of the present invention, the panel comprises a plurality of ports, each port having a plurality of electrically conductive terminals.

According to still another embodiment of the present invention, each port has a mating interface, including a contact portion of each terminal to the port.

According to a further another embodiment of the present invention, each port comprises an electrical connector receptacle.

According to still a further another embodiment of the present invention, the panel comprises a Light Emitting Diode (LED) unit for activating at least one LED being related to corresponding at least one Keystone Jack (KJ) of said panel.

According to an embodiment of the present invention, the electronic circuitry comprises at least one of the following:
a) at least one impedance connected to a corresponding terminal of the panel;
b) a power supply for supplying power to said electronic circuitry; and
c) at least one sense component for enabling sensing the change in one of voltage or current level.

According to another embodiment of the present invention, the electronic circuitry further comprises an amplifier for amplifying the voltage level on the at least one sense component, giving rise to the amplified voltage level to be further processed and analyzed for determining one or more physically connected devices.

According to still another embodiment of the present invention, the electronic circuitry further comprises a switch for enabling charging and discharging at least one capacitor, which is located within the device.

According to still another embodiment of the present invention, the power supply is located within the scanner.

According to still another embodiment of the present invention, the at least one sense component is located within the scanner.

According to a further embodiment of the present invention, the monitoring is performed over a conventional cabling infrastructure.

According to still a further embodiment of the present invention, the conventional cabling infrastructure relates to the fiber optics infrastructure.

According to an embodiment of the present invention, the data network is at least one of the following:
a) a local area network (LAN);
b) Ethernet;
c) a fire detection network;
d) an intrusion prevention network;
e) Intranet; and
f) Extranet.

According to an embodiment of the present invention, the device is one or more of the following:
a) a panel;
b) a node;
c) a switch;
d) a unit or component;
e) a system;
f) an outlet; and
g) a port.

According to another embodiment of the present invention, the outlet is provided with at least one impedance component.

According to still another embodiment of the present invention, the node is a remote node.

According to still another embodiment of the present invention, the panel is connected to a network switch.

According to still another embodiment of the present invention, the panel is physically located within a network switch.

According to a further embodiment of the present invention, the scanner is further connected to a server, said server configured to perform at least one of the following:
a) communicating with said scanner, and obtaining and storing the scanning results;
b) managing the devices over the data network; and
c) providing work orders over the data network.

According to still a further embodiment of the present invention, the monitoring is performed by using at least one of the following:
a) a differential mode; and
b) a single-ended mode.

According to another embodiment of the present invention, a system is configured to monitor patching between at least two devices over a data network, said system comprising at least one scanner being connected to each of said at least two devices over said data network for monitoring said patching, wherein at least one terminal of each device is connected to an electronic circuitry, which comprises one or more electronic components, for enabling said at least one scanner to determine changes in one of voltage or current level over at least one of said one or more electronic components, said changes occurring due to connecting or disconnecting each of said at least two devices over said data network, thereby enabling said at least one scanner to monitor patching between said at least two devices.

According to still another embodiment of the present invention, the at least two devices are interconnected by means of at least one patch cord.

According to still another embodiment of the present invention, the patch cord is at least one of the following or a combination thereof:
a) a copper wire cable; and
b) a fiber optics cable.

According to still another embodiment of the present invention, the scanner comprises a sensing unit configured to sense patching between the at least two panels, and configured to sense the physically connected devices over the data network.

According to a further embodiment of the present invention, each panel comprises a detection unit configured to enable detecting patching between the at least two panels, and/or configured to enable detecting the physically connected devices over the data network.

A method of monitoring devices that are physically connected over a data network comprises:
a) providing at least one scanner configured to monitor devices that are physically connected over the data network;
b) providing at least one panel connected to said at least one scanner over said data network, wherein at least one terminal of each panel is further connected to an electronic circuitry, which comprises one or more electronic components; and
c) determining changes in one of voltage or current level over at least one of said one or more electronic components, said changes occurring due to connecting or disconnecting devices over said data network, thereby enabling to monitor devices that are physically connected over said data network.

According to another embodiment of the present invention, a method of monitoring patching between at least two devices over a data network comprises:
a) providing at least one scanner being connected to each of the at least two devices over said data network, said at least one scanner configured to monitor said patching;
b) providing an electronic circuitry, which comprises one or more electronic components, said electronic circuitry connected to at least one terminal of each device; and
c) determining changes in one of voltage or current level over at least one of said one or more electronic components, said changes occurring due to connecting or disconnecting each of said at least two devices over said data network, thereby enabling to monitor patching between said at least two devices.

BRIEF DESCRIPTION OF THE DRAWINGS

In order to understand the invention and to see how it may be carried out in practice, preferred embodiments will now be described, by way of non-limiting examples only, with reference to the accompanying drawings, in which.

Figure 1:
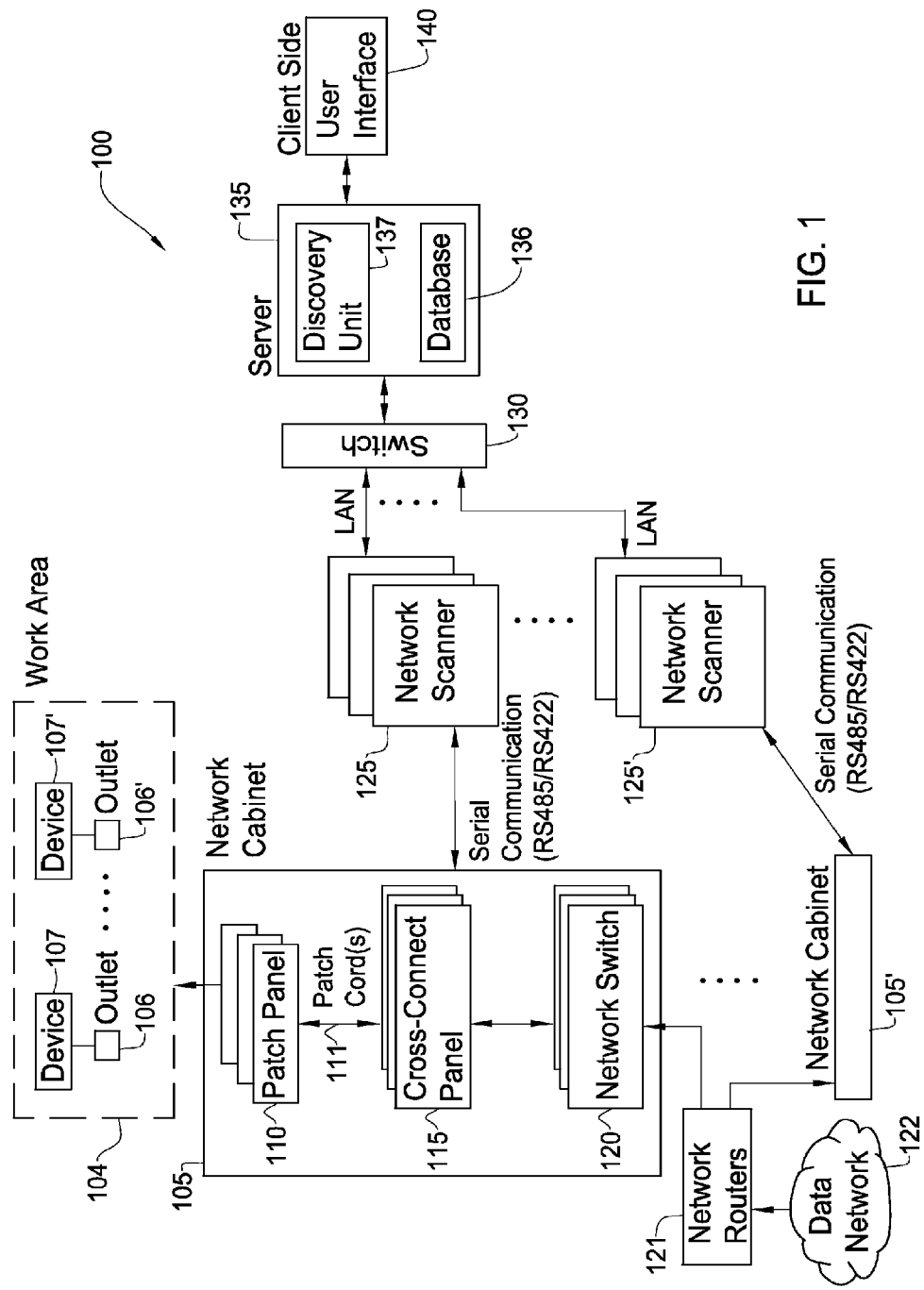
FIG. 1 is a schematic illustration of a cabling system, which enables monitoring and managing physically connected network devices over a local data network (such as a LAN, Ethernet, and the like), said network devices being either passive (e.g., switched OFF) or active (e.g., switched ON), according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, systems, procedures, components, units, devices, circuits and the like have not been described in detail so as not to obscure the present invention.

Unless specifically stated otherwise, as apparent from the following discussions, it is appreciated that throughout the specification discussions utilizing terms such as "processing", "computing", "calculating", "determining", "detecting", or the like, refer to the action and/or processes of a computer that manipulate and/or transform data into other data, said data represented as physical, e.g. such as electronic, quantities. The term "computer" should be expansively construed to cover any kind of electronic device with data processing capabilities, including, by way of non-limiting example, personal computers, servers, computing systems, communication devices, processors (e.g. digital signal processor (DSP), microcontrollers, field programmable gate array (FPGA), application specific integrated circuit (ASIC), etc.) and other electronic computing devices. Also, operations in accordance with the teachings herein may be performed by a computer specially constructed for the desired purposes or by a general purpose computer specially configured for the desired purpose by a computer program stored in a computer readable storage medium.

Hereinafter, it should be noted that when the term "device" is mentioned, it refers also to the term "unit", "component", "panel" (e.g., a patch panel, cross-connect panel), "switch", "system", "outlet", "port", "node" (such as a remote node and the like), and the like, which are used interchangeably.

FIG. 1 is a schematic illustration of a cabling system 100, which enables monitoring and managing physically connected network devices over a local data network (such as LAN and the like) on the physical layer (OSI Layer 1), said network devices being either passive (e.g., switched OFF) or active (e.g., switched ON), according to an embodiment of the present invention. System 100 comprises at least one network cabinet 105 for enabling the local network communication (e.g., Ethernet communication, and the like) within work area 104 that includes a plurality of remote nodes (such as personal computers, notebooks, printers, IP (Internet Protocol) phones, and other peripheral units/devices), each remote node being connected to the local data network by means of a network outlet 106; one or more network scanners 125, 125', etc. connected to one or more patch panels 110 and one or more cross-connect panels 115 that are provided within network cabinet 105, said one or more network scanners configured to monitor said local data network and determine the physical connectivity of devices 107 (e.g., remote nodes, panels, outlets, units/components, systems, switches, ports, etc.) over said local data network; and a server 135 configured to manage system 100 and communicate with said network scanners 125 for collecting the scan data (scanning results), including collecting IP and MAC (Media Access Control) addresses of all network devices (and/or collecting any other network data), for mapping and maintaining network devices, for providing work orders to said at least one network cabinet 105, and for performing any other management tasks.

According to an embodiment of the present invention, network cabinet 105 comprises a plurality of patch panels 110 configured to provide data communication over a local data network (e.g., LAN) to a plurality of remote nodes 107, each of said remote nodes being physically connected to a corresponding work area outlet 106; a plurality of cross-connect panels 115 configured to interconnect network switches 120 with corresponding patch panels 110, wherein said network switches 120 receive data communication from network routers 121 connected to a data network 122 (such as the Internet, WAN (Wide Area Network), and the like), and enable providing said data communication to remote nodes via said patch panels 110 and cross-connect panels 115. It should be noted that each network switch 120 can be connected to a corresponding cross-connect panel 115, which in turn can be connected to one or more patch panels 110. The more remote nodes 107 that are provided within the work area, the larger the number of patch panels 110 that may be required; i.e., the more end units/devices 107 that are physically connected to a local data network, the greater the number of ports of cross-connect panels 115 that are occupied.

According to an embodiment of the present invention, network scanner 125 monitors the local data network over the physical layer (OSI Layer 1) for determining or identifying devices (e.g., patch panels, cross-connect panels, remote nodes, outlets, etc.) that are physically connected. It should be noted that said monitoring can be continuous monitoring, which is performed automatically and substantially in real-time. Then, the monitoring results (scan results, including IP and MAC addresses of connected network devices) of each network scanner 125 can be stored within a central database (e.g., a SQL (Structured Query Language) or Oracle database 136), provided for example within server 135, enabling said server 135 to map and maintain all local network devices (e.g., patch panels, cross-connect panels, remote nodes, outlets, etc.). In addition, server 135 associates the physical location of each device (determined by scanning the network) and its corresponding IP and MAC address (detected by a discovery unit 137 of said server 135 over OSI Layer 2, 3, 4, etc.), and then stores this data within said database 136 for future usage. When a new device is detected over the physical layer, network scanner 125 may provide an alarm (e.g., may send a service message) to a system administrator, indicating the time and an exact physical location (within the work area) of such a new device. Also, the alarm may be provided when detecting an expected or unexpected change in the patch cord connections, expected or unexpected disconnection of or at work area outlets, or for any other predefined reason. Furthermore, these changes in the cabling infrastructure can be stored within database 136, which can be continuously updated to contain the most recent configuration of all local network devices (e.g., to store the substantially real-time configuration of system 100). Each network scanner 125 can monitor a plurality (e.g., hundreds, thousands) of: network outlets (in turn, thousands of passive and active devices, which may be connected to said outlets); patch cords, interconnecting patch panels 110 with corresponding cross-connect panels 115; peripheral devices ports; and the like. According to an embodiment of the present invention, network scanners 125 communicate with server 135 over the LAN by using a conventional switch 130, which enables connecting a plurality of said network scanners to said server 135. It should be noted that each network scanner 125 has a dedicated IP address, and it can operate autonomously and independently of server 135. The server can retrieve the scan data (e.g., regarding connected/disconnected network elements, such as patch cords, devices, and the like) collected by network scanners 125 by using, for example, a conventional Web service or FTP (File Transfer Protocol) communication, while each network scanner 125 receives and transmits data to the patch/cross-connect panels by using its I/O (Input/Output) interface 305 (FIG. 3) that may include conventional units/components. Also, it should be noted that one or more network scanners 125 can be physically located internally or externally to the network cabinets.

According to an embodiment of the present invention, network scanner 125 communicates with patch panels 110 and cross-connect panels 115 by using conventional serial communication, such as RS485 (Recommended Standard 485) and RS422. In addition, such serial communication can be accomplished by connecting said patch panels 110 and cross-connect panels 115 by means of conventional cables, such as RJ45 (Registered Jack 45) or RJ11 cables (being related to a conventional cabling infrastructure). Each network scanner 125 can be connected to a plurality of patch panels 110 and cross-connect panels 115 (e.g., twenty-four patch panels 110 and twenty-four corresponding cross-connect panels 115). Also, it should be noted that each patch panel 110 and each cross-connect panel 115 has a plurality of input/output ports, such as twenty-four ports.

Figure 3:
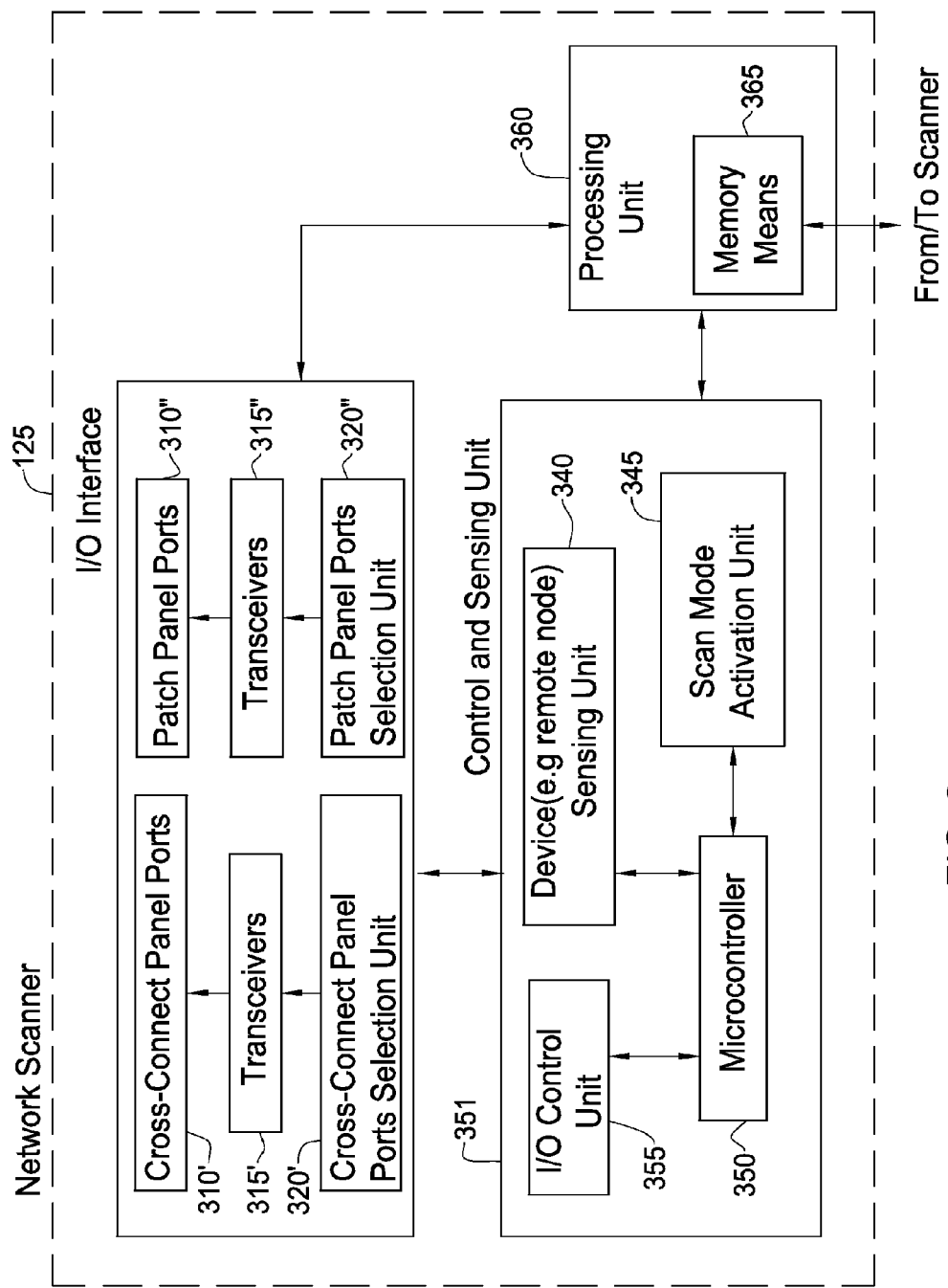
FIG. 3 is a schematic block-diagram of a network scanner architecture, according to an embodiment of the present invention.

According to an embodiment of the present invention, network scanner 125 scans the local network and detects patching between patch panels 110 and cross-connect panels 115, and also detects physically connected active or passive network devices by using a device sensing unit 340 (FIG. 3). As depicted therein, there are five basic scan-modes, for example: a) detecting patching between patch panels 110 and cross-connect panels 115 (referred as a patching scan-mode); b) detecting physically connected network devices based on their impedance (resistance and, optionally, inductance, capacitance, and the like) characteristics (referred as an impedance scan-mode); c) detecting physically connected network devices based on their inductance characteristics (referred as an inductance scan-mode); d) detecting physically connected network devices based on their capacitance characteristics (referred as a capacitance scan-mode); and e) detecting the connection of a cable (such as a fiber optics cable, as presented in FIGS. 8B and 8C) to at least one port (e.g., port A) of a CC or PP panel (referred as a port detection scan mode). For performing the scan based on each scan-mode, the network scanner 125 has to be set to a corresponding scan-mode either manually by a system administrator connected to server 135 via user Interface 140, or automatically, enabling continuous monitoring, performed substantially in real-time.

According to an embodiment of the present invention, a system administrator can manage system 100 and provide work orders to the network scanners and network cabinets by means of a user Interface 140 (at the client side). It should be noted that a work order can be, for example to interconnect a specific patch panel 110 with a corresponding cross-connect panel 115 for enabling the connection of new remote nodes over a local data network, or removing unused connected patch cords within network cabinet 105; i.e., the work orders may be related, for example, to adding or removing devices from the local network. In addition, it should be noted that the system administrator can manage and configure all local networks devices by means of a variety of applications installed on server 135, such as management applications (e.g., configuring a hierarchical tree of cabling work areas, performing patching design of network devices, etc.), monitoring applications (e.g., observing a network status substantially in real-time, etc.), data transmission applications (e.g., gathering and transmitting data from server 135 and network scanners 125, etc.), maintenance applications (e.g., gathering remote nodes actions, analyzing network device failures, gathering all network alarms, performing database backup recoveries, etc.), network scanner control applications (e.g., configuring network scanners operation, activating BIST (Built-In Self-Test) of said network scanners, etc.), patch/cross-connect control applications, authentication applications (e.g., verifying licenses, etc.), and the like. Further, the system administrator can perform all required firmware upgrades and debugging via said server 135.

Figure 8A:
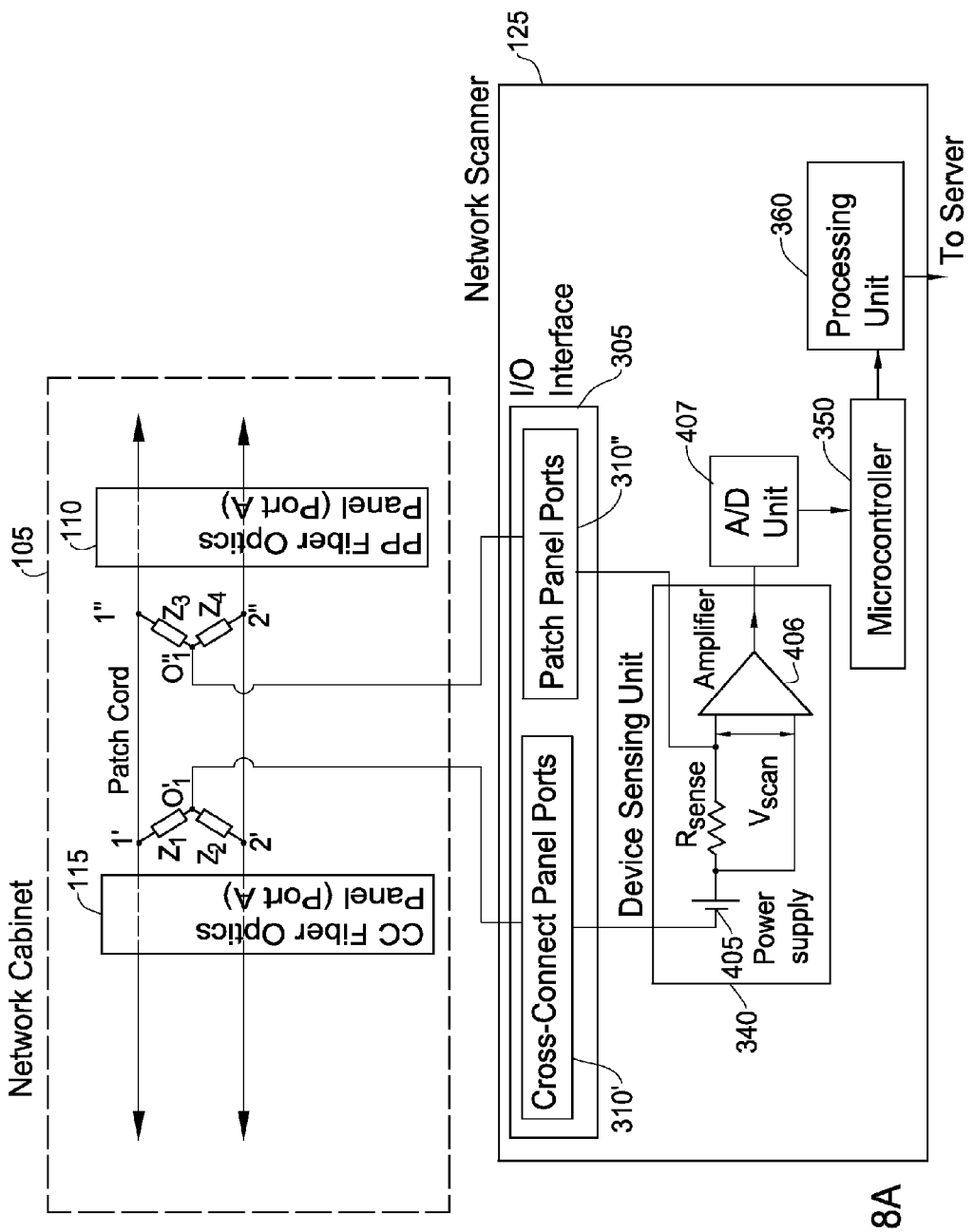
FIG. 8A is a schematic illustration of a patch cord detecting scheme, which refers to a patch cord scan-mode, while using fiber optics (FO) cabling (FO infrastructure), according to an embodiment of the present invention.
Figure 8B:
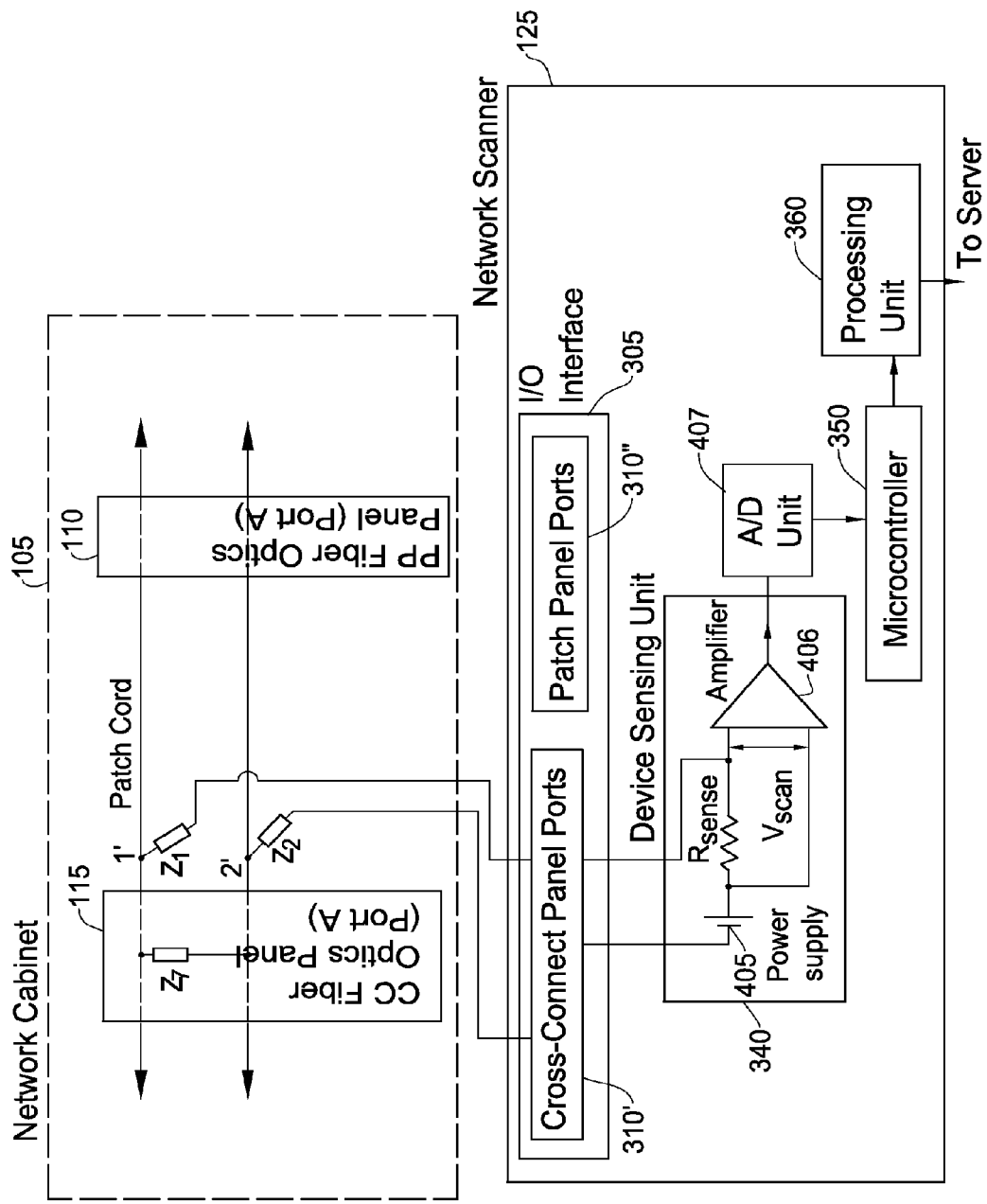
FIGS. 8B and 8C are schematic illustrations of a port detecting scheme, enabling detecting a connection of a FO cable to at least one port of the CC fiber optics panel and PP fiber optics panel, respectively, while using fiber optics cabling, according to another embodiment of the present invention.
Figure 8C:
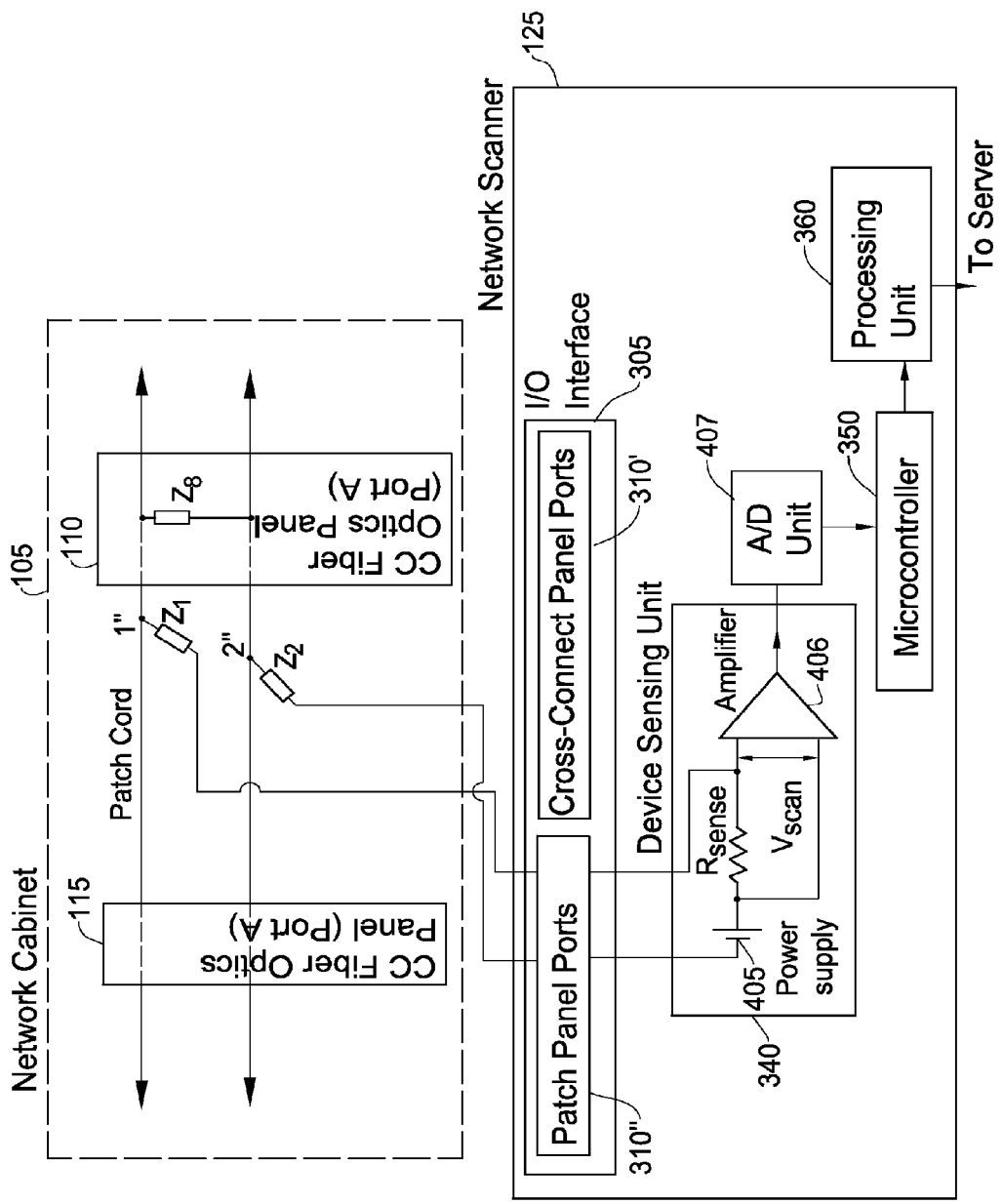

It should be noted that according to an embodiment of the present invention, instead of using RJ45/RJ11 socket/plug cables (e.g., copper wire cables) any types of cables can be used, such as Cat3 (Category 3) cables, Cat5/5e (Category 5/5e) cables, Cat6/6a (Category 6/6a) cables, and the like can be used. In addition, instead of using RJ45/RJ11 cables, fiber optics cables can be used, as schematically illustrated in FIGS. 8A to 8C.

In addition, it should be noted that according to an embodiment of the present invention, some examples of local (data) networks can be one or more of the following: a local area network (LAN), Ethernet, a fire detection network, an intrusion prevention network, Intranet, Extranet, and the like.

Also, it should be noted that according to an embodiment of the present invention, one or more cross-connect panels 115 and/or one or more patch panels 110 may be integrated within network switch 120. In addition, patch panel 110 can be used instead of cross-connect panel 115, and vice-versa.

Figure 2A:
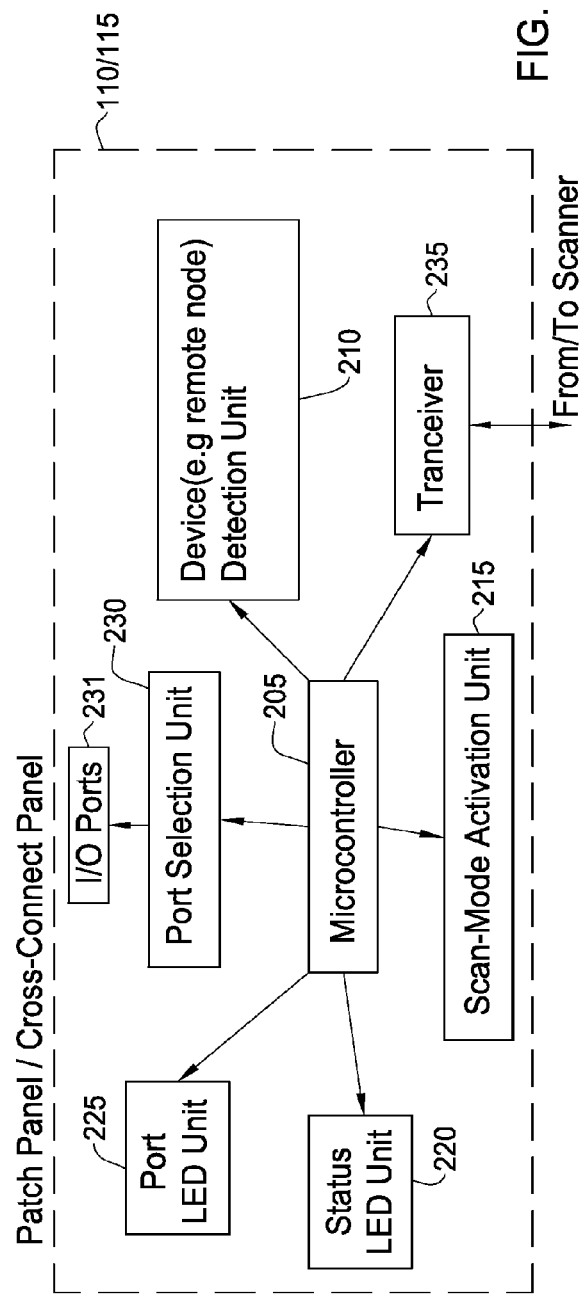
FIG. 2A is a schematic block-diagram of a patch panel (or a cross-connect panel), according to an embodiment of the present invention.

FIG. 2A is a schematic block-diagram of patch panel 110 or cross-connect panel 115, according to an embodiment of the present invention. It should be noted that according to this embodiment of the present invention, patch panel 110 and cross-connect panel 115 are substantially identical, thus having substantially identical hardware and, optionally, software components/units. Thus, said patch and cross-connect panels may be defined by their function of the physical location, and not by their structure. However, according to another embodiment of the present invention, it may be possible for the patch panel(s) 110 and cross-connect panel(s) 115 to be different (either from the hardware or software point of view) and provide different functionality. Further, according to still another embodiment of the present invention, either cross-connect panel 115 or patch panel 110 can be eliminated, as schematically illustrated in FIGS. 9A to 9D.

According to an embodiment of the present invention, patch panel 110 (or cross-connect panel 115) comprises a microcontroller 205 configured to control operation of said patch panel 110; a port selection unit 230 for selecting corresponding ports; a device (e.g., a remote node) detection unit 210 for enabling detecting physically connected devices over a local data network, such as a LAN; a scan-mode activation unit 215 for activating a corresponding scan-mode for enabling said detection of the physically connected devices; a port LED (Light Emitting Diode) unit 225 for activating one or more port LEDs related to corresponding Keystone Jacks of said patch panel 110, according to a command received from microcontroller 205; a status LED unit for activating one or more status LEDs related to said patch panel 110; and a transceiver 235 for enabling receiving and transmitting data to or from said patch panel 110.

According to an embodiment of the present invention, scan-mode activation unit 215 can comprise one or more switches that can be activated/deactivated (switched ON/OFF) in a desired sequence, to establish a desired scan-mode. Thus, for example, scan-mode activation unit 215 can comprise two or four switches, for enabling activation of each scan-mode, with one or more switches being closed/opened, according to instructions (commands) received from microcontroller 205 and/or processing unit 360 (FIG. 3) of network scanner 125.

Figure 2B:
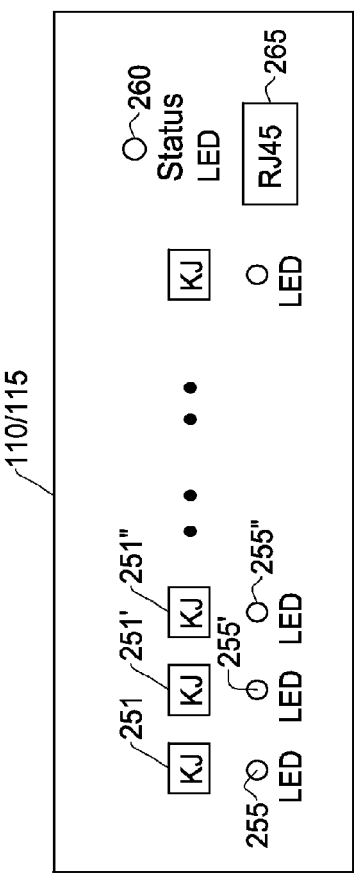
FIG. 2B is a sample illustration of a patch panel (or a cross-connect panel), according to an embodiment of the present invention.

FIG. 2B is a sample illustration or example of patch panel 110 (or cross-connect panel 115), according to an embodiment of the present invention. According to this embodiment, each panel has a plurality of input/output ports (e.g., twenty-four ports) provided with conventional or dedicated keystone jack (KJ) sockets 251, 251', 251", etc. In turn, near each KJ socket, may be provided with one or more LEDs 255, 255', 255", etc. Each LED may be activated by means of microcontroller 205 (FIG. 2A), when desired: for example, for guiding a technician of system 100 to a particular socket of the patch/cross-connect panel, in which a new connection (e.g., cable) should be added. In addition, each patch panel 110 comprises at least one status LED 260, which can be automatically activated, for example, when said patch panel 110 is experiencing a malfunction (the status LEDs of each patch/cross-connect panel can have different colors, according to the status they indicate, such as malfunction status, disconnection status, and the like). Similarly, the system administrator can send an instruction (by means of server 135) to microcontroller 205 of a specific patch panel 250 to activate its status LED 260 for guiding the technician to said specific patch panel 250.

According to an embodiment of the present invention, each patch panel 110 or cross-connect panel 115 comprises a conventional socket (such as a RJ45 socket) 265 for enabling the connection to network scanner 125 (FIG. 1).

It should be noted that according to an embodiment of the present invention, the device/panel (e.g., a PP or CC panel) comprises a plurality of ports, each port having a plurality of electrically conductive terminals. Also, according to an embodiment of the present invention, at least one port of said device/panel has a mating interface, including a contact portion of each terminal to the port.

FIG. 3 is a schematic block-diagram of the network scanner 125 architecture, according to an embodiment of the present invention. According to this embodiment, network scanner 125 comprises I/O (Input/Output) Interface 305 for enabling communications with the patch/cross-connect panels; a processing unit 360 for controlling operation of said network scanner 125, for sending and receiving instructions/data related to the network elements, for managing the execution of work orders, and for any other processing tasks; and a control and sensing unit 351 for enabling sensing physically connected network devices, that may be either active (switched ON) or passive (switched OFF).

According to an embodiment of the present invention, I/O (Input/Output) Interface 305 comprises a plurality of cross-connect panel input/output ports 310' for enabling the connection of cross-connect panels 115 (FIG. 1) to said network scanner 125; a plurality of patch panel input/output ports 310" for enabling the connection of patch panels 110 (FIG. 1) to said network scanner 125; a plurality of transceivers 315' and 315" for enabling the receipt and transmission of instructions and data to and/or from said network scanner 125; and port selection units 320' and 320" (that contain, for example, a plurality of multiplexers) for selecting corresponding ports and transceivers to be used.

According to another embodiment of the present invention, control and sensing unit 351 comprises microcontroller 350 for controlling operation of said control and sensing unit 351, for selecting corresponding cross-connect/patch panel ports 310'/310", and for receiving and processing scan results; I/O control unit 355 for controlling operation of I/O interface 305 and enabling receiving or transmitting instructions to and/or from microcontroller 350 and/or processing unit 360; device sensing unit 340 for enabling the detection of patches between patch panels and cross-connect panels, and enabling the detection of physically connected network devices; and a scan-mode activation unit 345 for setting said network scanner 125 into a desired scan mode. As stated above, there are five basic scan-modes: a) detecting patches (presence of patch cords) between patch panels 110 (FIG. 1) and cross-connect panels 115 (FIG. 1); b) detecting physically connected network devices (e.g., remote nodes 107 (FIG. 1), network switches 120 (FIG. 1)) based on the impedance characteristics of said devices; c) detecting physically connected network devices based on their inductance characteristics; d) detecting physically connected network devices based on their capacitance characteristics; and e) detecting the connection of a cable (such as a fiber optics cable, as presented in FIGS. 8B and 8C) to at least one port (e.g., port A) of a CC or PP panel (referred as a port detection scan mode). In addition, it should be noted that for performing the scan based on each scan-mode, the network scanner 125 can be set by means of scan-mode activation unit 345 to a corresponding scan-mode either manually, for example, by receiving an instruction from a system administrator via server 135 or automatically, enables continuously scanning of system 100, substantially in real-time.

According to still another embodiment of the present invention, scan-mode activation unit 345 can comprise one or more switches that can be activated/deactivated (switched ON/OFF) in a desired sequence, to establish a desired scan-mode. Thus, for example, scan-mode activation unit 345 can comprise two or four switches, for enabling activation of each scan-mode, with one or more switches being closed/opened, according to instructions (commands) received from microcontroller 350 and/or processing unit 360.

According to a further embodiment of the present invention, processing unit 360 has programmable memory means 365 that contains, for example, an installed operating system (OS) for operating said network scanner 125, setting its various properties, and in turn, enabling it to scan said system 100 and process the obtained scan results. Processing unit 360 can communicate with control and sensing unit 340 by using, for example, conventional serial communication (e.g., RS485, RS422 communication). In addition, network scanner 125 can also communicate with the cross-connect panels and patch panels (connected to said network scanner 125 through corresponding ports 310' and 310") by means of said conventional serial communication. In turn, network scanner 125 can be physically connected to the above panels by means of a conventional RJ45-socket cable. It should be noted that such a conventional RJ45 socket has eight conductors/signal wires, for providing power, providing analog data (e.g., scan data), and for enabling the serial data communication (e.g., between processing unit 360 of network scanner 125 and microcontroller 205 of the patch/cross-connect panel). It should be noted that either microcontroller 350 of network scanner 125 or microcontroller 205 of each patch/cross-connect panel can also have a programmable memory means.

Figure 4:
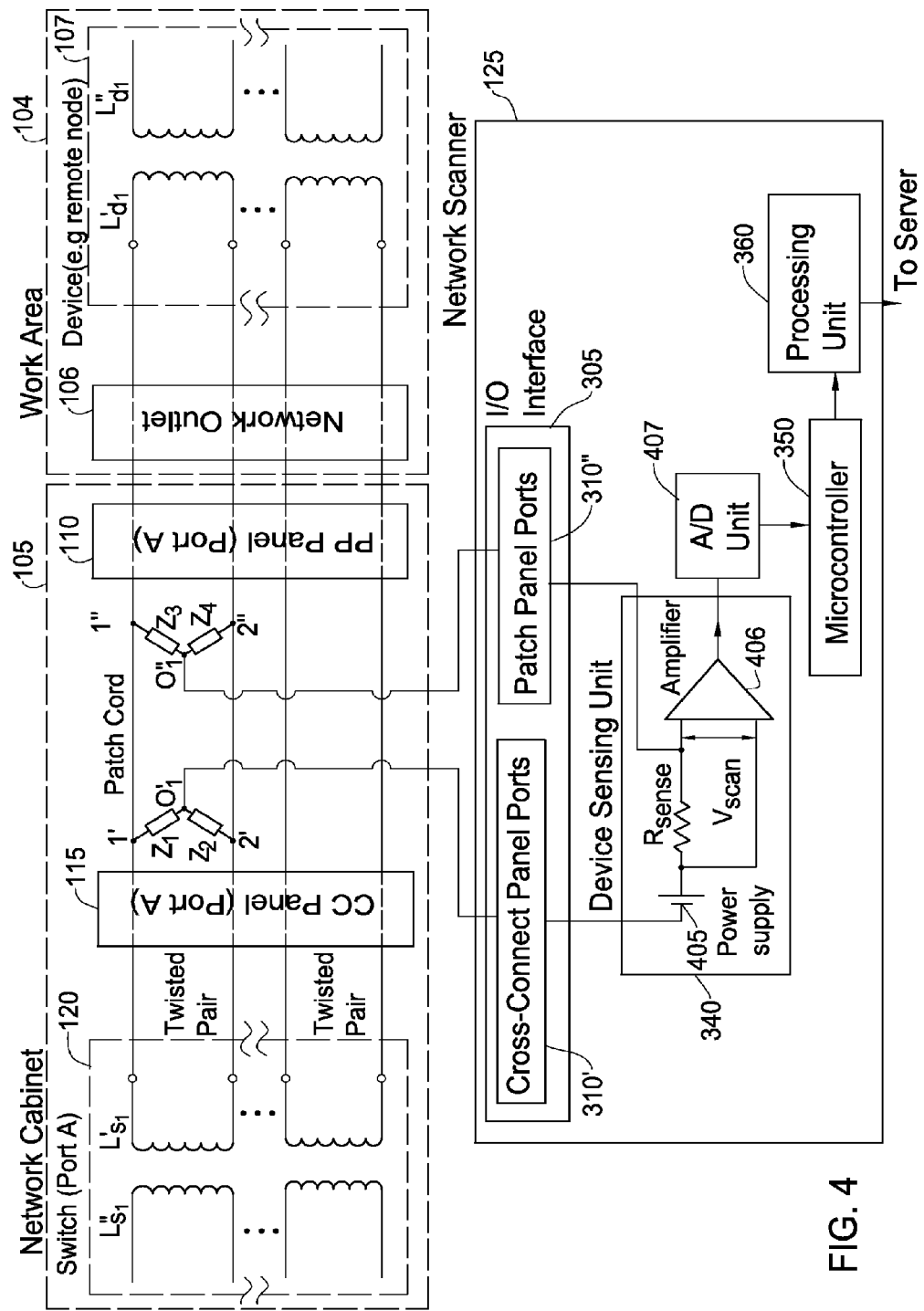
FIG. 4 is a sample illustration of a patch cord detecting scheme, which refers to a patch cord scan-mode, according to an embodiment of the present invention.

FIG. 4 is a sample illustration of a patch cord detecting scheme, which refers to a patch cord scan-mode, according to an embodiment of the present invention. According to this embodiment, each port (such as port "A") of network switch 120 and/or remote node 107 can be presented, for example, as a set of inducting components (such as inductors $L_{s1}'$ and $L_{s1}''$. $Z_1$ and $Z_2$ impedances are connected to terminals 1' and 2', respectively, of the cross-connect (CC) panel 115 (e.g., of its port "A"). Similarly, $Z_3$ and $Z_4$ impedances are connected to terminals 1" and 2", respectively, of the patch panel (PP) 110 (e.g., of its port "A"). It should be noted that according to an embodiment of the present invention, each of the above impedances $Z_1$, $Z_2$, $Z_3$ and $Z_4$ can be one or more of the following: one or more resistors, inductors, capacitors, and/or one or more other electronic components/units. Also, it should be noted that $Z_1$ and $Z_2$ impedances are interconnected at the point $O_1'$, and $Z_3$ and $Z_4$ impedances are interconnected at the point $O_1''$, respectively.

According to an embodiment of the present invention, device sensing unit 340 of network scanner 125 comprises a power supply 405 (e.g., either AC (Alternating Current) and/or DC (Direct Current) power supply) for feeding an electrical circuit defined by: inductors $L_{s1}'$ and $L_{d1}'$, impedances $Z_1$, $Z_2$, $Z_3$ and $Z_4$, and by $R_{sense}$ resistor (or any other sense component/unit). Further, $R_{sense}$ resistor is connected to amplifier 406 for enabling amplifying voltage $V_{scan}$ on said $R_{sense}$ resistor. In turn, the output analog signal, provided from said amplifier 406, is conveyed into microcontroller 350 for analyzing it. It should be noted that before being processed by means of said microcontroller 350, the above analog signal is converted into a corresponding digital signal by means of an Analog-to-Digital (A/D) unit 407 either provided within said microcontroller 350 or located externally to said microcontroller 350. Then, according to a voltage level of the amplified output signal, microcontroller 350 can determine whether terminals 1' and 1" and/or terminals 2' and 2" of cross-connect and patch panels 115/110, respectively, are connected by means of patch cords. For this, the above voltage level of the amplified output signal is compared by means of microcontroller 350 with a predefined reference voltage level. Then, the result of said comparison is processed, analyzed (either by microcontroller 350 and/or processing unit 360) and conveyed to server 135 (FIG. 1).

It should be noted that according to another embodiment of the present invention, one or more admittances are used instead of said each impedance $Z_1$, $Z_2$, $Z_3$ or $Z_4$. Also, additional impedances (or admittances) can be connected to other terminals of patch/cross-connect panels for determining patches between said patch/cross-connect panels. In addition, it should be noted that each of said impedances/admittances can have any value. Also, each of the above impedances/admittances can be substantially equal to (or different from) another impedance/admittance, respectively.

Further, according to another embodiment of the present invention each impedance/admittance can be connected or disconnected either manually or automatically by one or more switches (not shown).

Also, it should be noted that according to another embodiment of the present invention, instead of using sense resistor $R_{sense}$, any other one or more sensing components or units can be used.

Figure 5A:
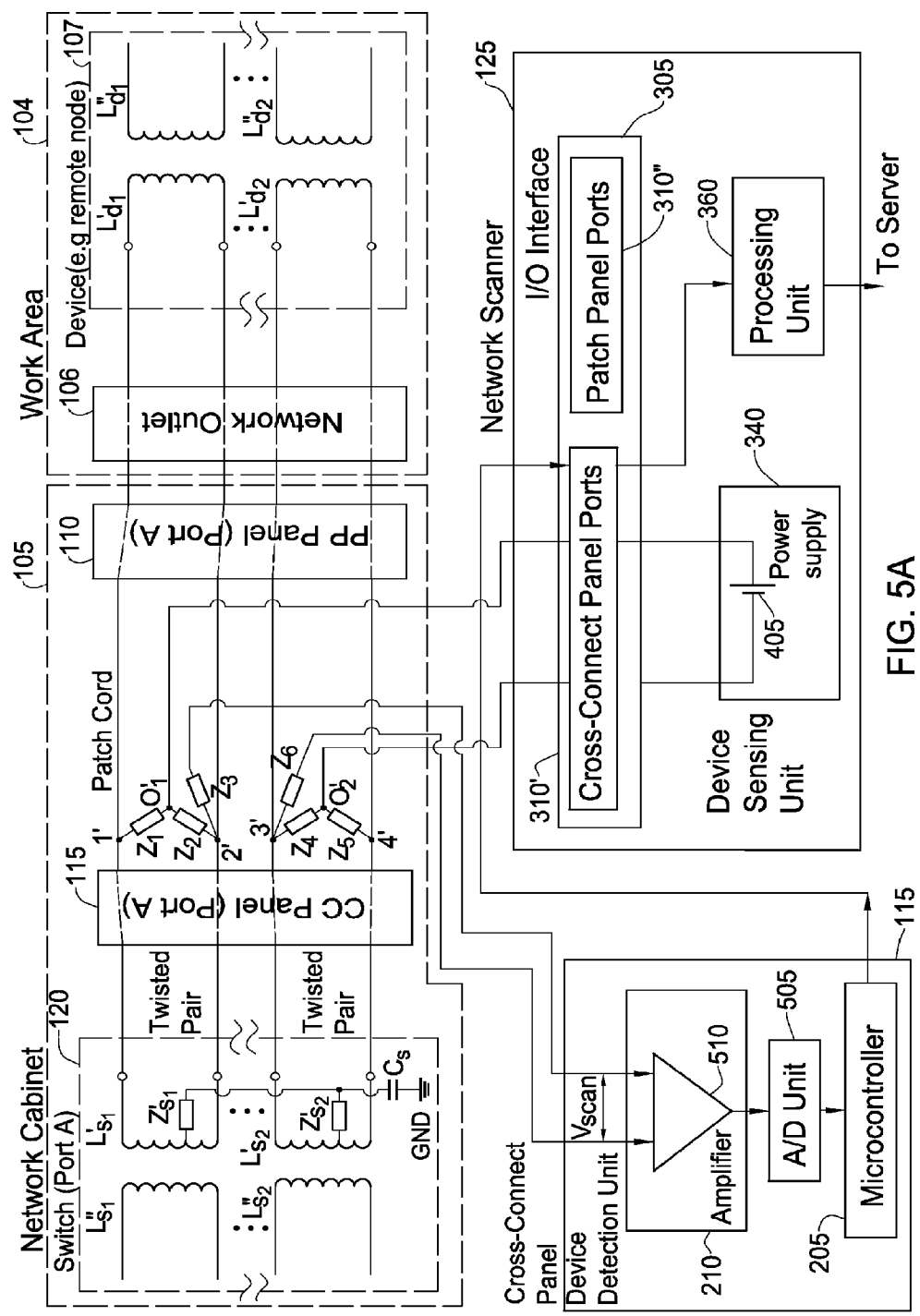
FIG. 5A is a sample illustration of a network switch detecting scheme, which refers to an impedance scan-mode from a network switch, according to an embodiment of the present invention.

FIG. 5A is a sample illustration of a network switch 120 detecting scheme, which refers to an impedance scan-mode from a network switch, according to an embodiment of the present invention. According to this embodiment, each port (such as port "A") of network switch 120 can be presented, for example, as a set of impedance components $Z_{s1}'$, $Z_{s2}''$, etc. (e.g., resistors and, optionally, inductors, capacitors, and the like), as generally presented in FIG. 5A. In addition, $Z_1$ and $Z_2$ impedances are connected to terminals 1' and 2', respectively, of cross-connect panel 115 (e.g., of its port "A"), as well as impedances $Z_4$ and $Z_5$, which are connected to terminals 3' and 4', respectively.

According to this embodiment of the present invention, device sensing unit 340 of network scanner 125 comprises a power supply 405 for feeding an electrical circuit defined by: inductors $L_{s1}'$ and $L_{s2}'$, switch impedances $Z_{s1}'$ and $Z_{s2}''$, impedances $Z_1$ to $Z_6$ and capacitor $C_s$, which is connected to the ground (GND). Junctions $O_1'$ and $O_2'$ of the interconnection of said impedances $Z_1$, $Z_2$, $Z_3$ and $Z_4$, $Z_5$, $Z_6$, respectively, are connected to amplifier 510, which can be provided, for example, within cross-connect panel 115. The amplifier amplifies the $V_{scan}$ voltage signal, which is conveyed into its input terminals, and then outputs a corresponding amplified signal into A/D unit 505 to be further provided into microcontroller 205 of said cross-connect panel 115. Then, according to a voltage level of the amplified output signal, microcontroller 205 can determine whether switch 120 is physically connected (by means of its port "A") to cross-connect panel 115. For this, the above amplified voltage level is compared by means of microcontroller 205 with a predefined reference voltage level. Then, the result of said comparison is processed, analyzed (either by microcontroller 205 and/or processing unit 360 of network scanner 125) and conveyed to server 135 (FIG. 1).

It should be noted that according to an embodiment of the present invention, additional impedances can be connected to other terminals of the patch/cross-connect panels for determining (identifying) the physical connectivity of devices over the local data network.

Figure 5B:
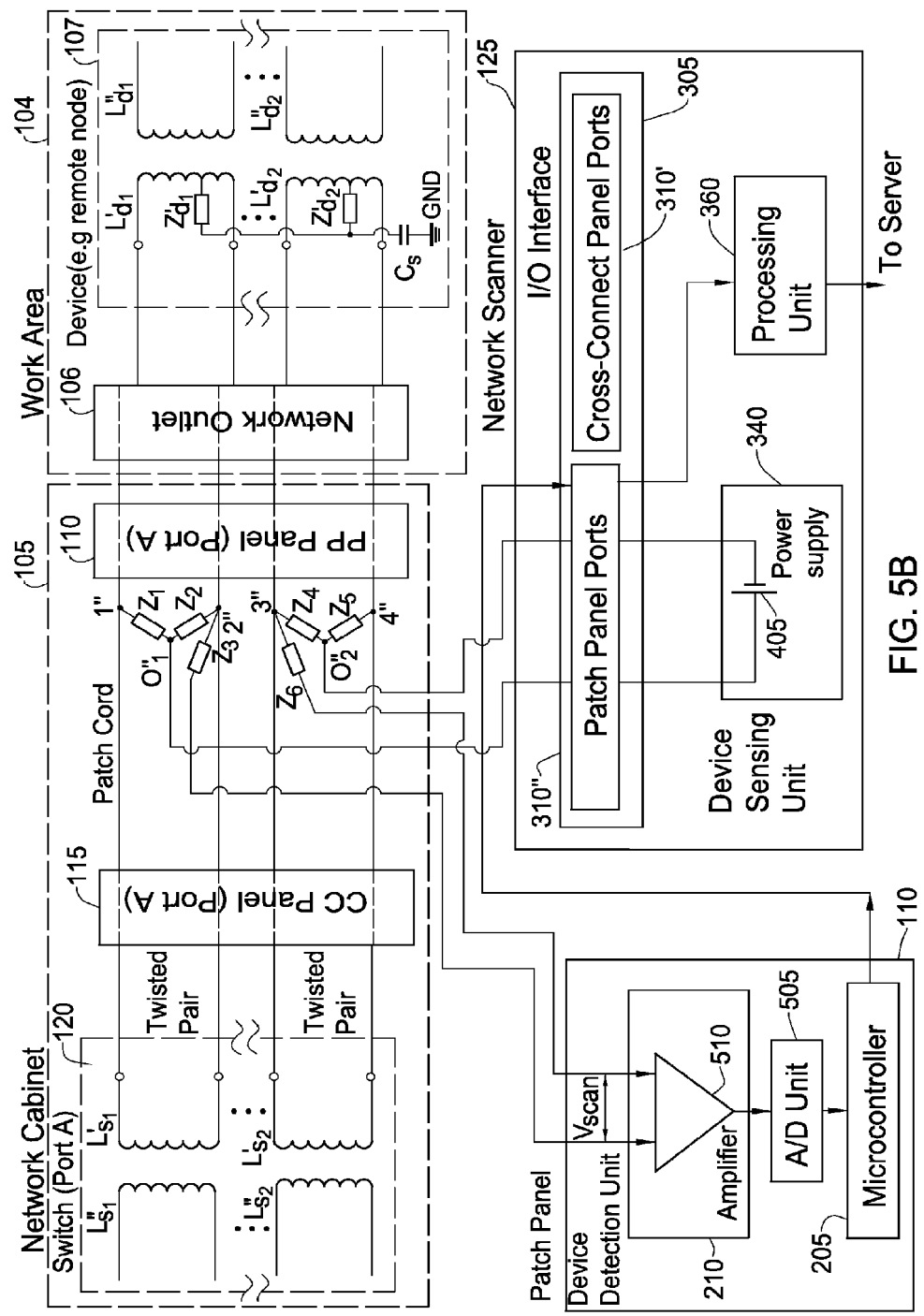
FIG. 5B is a sample illustration of a remote node detecting scheme, which refers to an impedance scan-mode from a remote node, according to an embodiment of the present invention.

FIG. 5B is a sample illustration of a remote node 107 detecting scheme, which refers to an impedance scan-mode from a remote node, according to an embodiment of the present invention. According to this embodiment, a network device (such as remote node 107) can be presented, for example, as a set of impedance components $Z_{d1}'$, $Z_{d2}''$, etc. (e.g., resistors and, optionally, inductors, capacitors, and the like), as generally presented in FIG. 5B. In addition, $Z_1$ and $Z_2$ impedances are connected to terminals 1" and 2", respectively, of patch panel (PP) 110 (e.g., of its port "A"), as well as impedances $Z_4$ and $Z_5$, which are connected to terminals 3" and 4", respectively.

It should be noted that this embodiment of the present invention, is similar to the embodiment of FIG. 5A. The difference is that according to the embodiment of FIG. 5B, the network scanner 125 determines whether a specific network element, such as remote node 107, is physically connected to patch panel 110.

According to this embodiment of the present invention, device sensing unit 340 of network scanner 125 comprises a power supply 405 for feeding an electrical circuit defined by: inductors $L_{d1}'$ and $L_{d2}'$, device impedances $Z_{d1}'$ and $Z_{d2}''$, impedances $Z_1$ to $Z_6$, and capacitor $C_d$, which is connected to the ground (GND). Junctions $O_1''$ and $O_2''$ of the interconnection of said impedances $Z_1$, $Z_2$, $Z_3$ and $Z_4$, $Z_5$, $Z_6$, respectively, are connected to amplifier 510, which can be provided, for example, within patch panel 110. The amplifier amplifies the $V_{scan}$ voltage signal, which is conveyed into its input terminals, and then outputs a corresponding amplified signal into A/D unit 505 to be further provided into microcontroller 205 of said patch panel 110. Then, according to a voltage level of the amplified output signal, microcontroller 205 can determine whether remote node 107 is physically connected (via network outlet 106) to patch panel 110. For this, the above amplified voltage level is compared by means of microcontroller 205 with a predefined reference voltage level. Then, the result of said comparison is processed, analyzed (either by microcontroller 205 and/or processing unit 360 of network scanner 125) and conveyed to server 135 (FIG. 1).

Figure 5C:
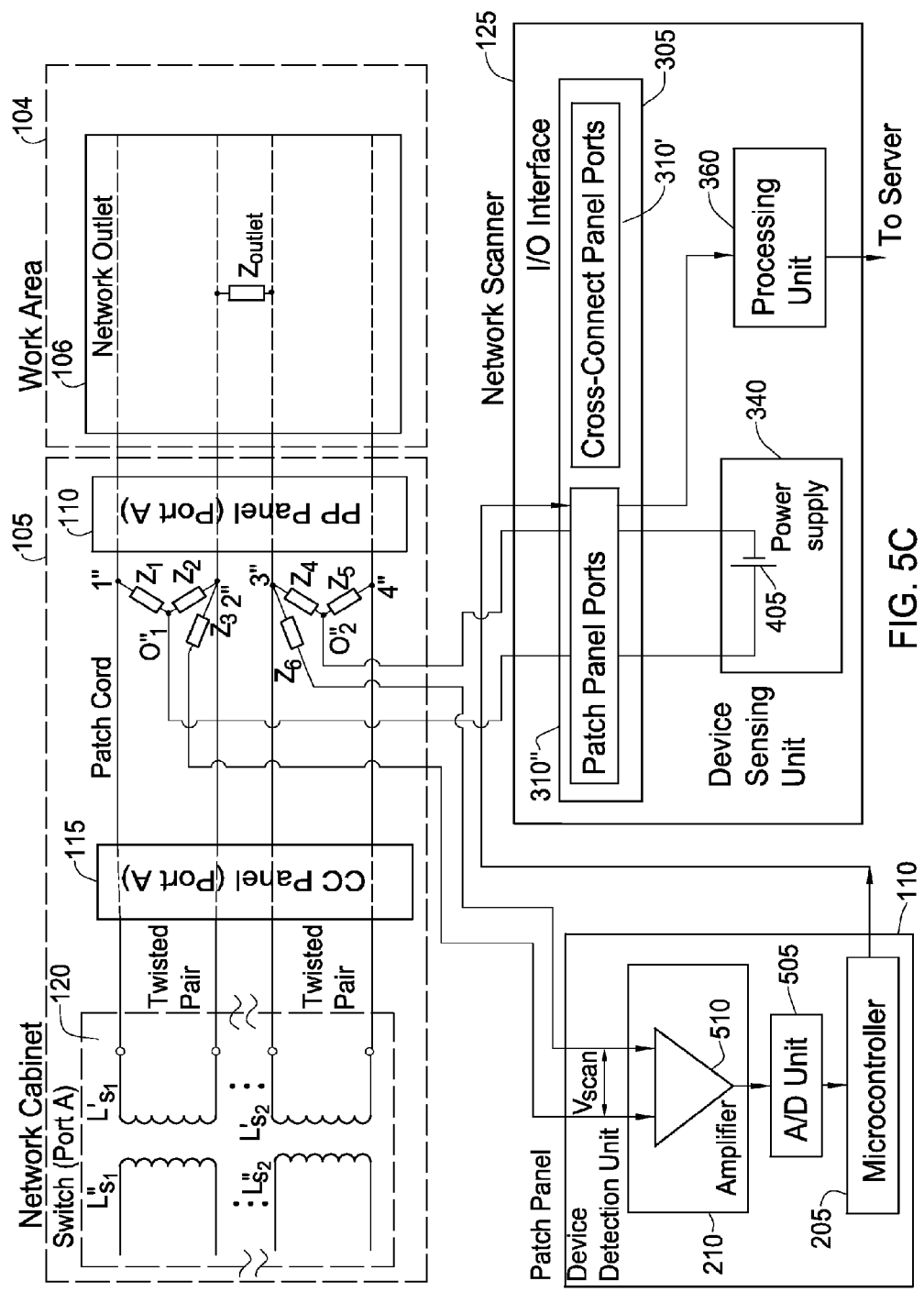
FIG. 5C is a sample illustration of an outlet detecting scheme, which refers to an impedance scan-mode from a remote node, according to another embodiment of the present invention.

FIG. 5C is a sample illustration of an outlet 106 detecting scheme, which refers to an impedance scan-mode from a remote node 107 (FIG. 1), according to another embodiment of the present invention. According to this embodiment, a network outlet 106 is presented as an impedance component $Z_{outlet}$ (e.g., a resistor and, optionally, inductor, capacitor, and the like); i.e., network outlet 106, for example, can be provided with a stuffer cap comprising said impedance component $Z_{outlet}$. In addition, similarly to FIG. 5B, the impedances $Z_1$ and $Z_2$ are connected to terminals 1" and 2", respectively, of patch panel (PP) 110, as well as impedances $Z_4$ and $Z_5$, which are connected to terminals 3" and 4", respectively.

According to this embodiment of the present invention, device sensing unit 340 of network scanner 125 comprises a power supply 405 for feeding an electrical circuit defined by: impedances $Z_1$ to $Z_6$ and outlet impedance $Z_{outlet}$. Also, similarly to FIG. 5B, junctions $O_1''$ and $O_2''$ of the interconnection of said impedances $Z_1$, $Z_2$, $Z_3$ and $Z_4$, $Z_5$, $Z_6$, respectively, are connected to amplifier 510, which can be provided, for example, within patch panel 110. According to a voltage level of the amplified output signal, microcontroller 205 can determine whether network outlet 106 is physically connected to patch panel 110. For this, the above amplified voltage level is compared by means of microcontroller 205 with a predefined reference voltage level. Then, the result of said comparison is processed, analyzed (either by microcontroller 205 and/or processing unit 360 of network scanner 125) and conveyed to server 135 (FIG. 1).

Figure 6A:
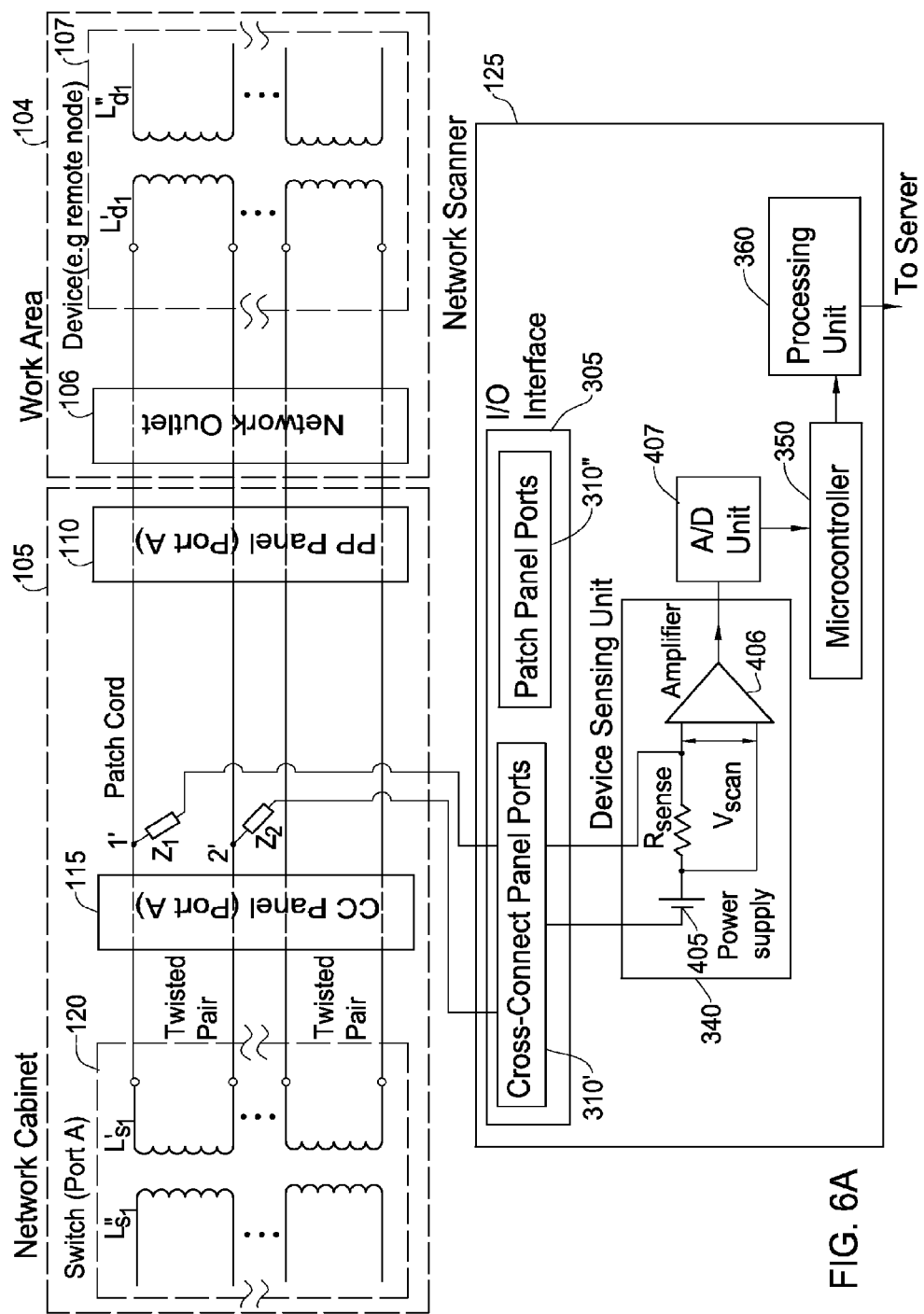
FIG. 6A is a sample illustration of a network switch detecting scheme, which refers to an inductance scan-mode from a network switch, according to an embodiment of the present invention.

FIG. 6A is a sample illustration of a network switch 120 detecting scheme, which refers to an inductance scan-mode from a network switch, according to an embodiment of the present invention. According to this embodiment, each port (such as port "A") of network switch 120 is presented, for example, as a set of inducting components, such as inductors $L_{s1}'$ and $L_{s1}''$. $Z_1$ and $Z_2$ impedances are connected to terminals 1' and 2', respectively, of the cross-connect (CC) panel 115.

According to an embodiment of the present invention, device sensing unit 340 of network scanner 125 comprises a power supply 405 for feeding an electrical circuit defined by: inductor $L_{s1}'$, impedances $Z_1$ and $Z_2$, and $R_{sense}$ resistor. $R_{sense}$ resistor is connected to amplifier 406 for enabling amplifying voltage $V_{scan}$ on said $R_{sense}$ resistor. In turn, the output analog signal, provided from said amplifier 406, is conveyed into microcontroller 350 for processing and analyzing it. Then, according to a voltage level of the amplified output signal, microcontroller 350 can determine whether network switch 120 is connected to cross-connect panel 115. For this, the above voltage level of the amplified output signal is compared by means of microcontroller 350 with a predefined reference voltage level. Then, the result of said comparison is processed, analyzed (either by microcontroller 350 and/or processing unit 360) and conveyed to server 135 (FIG. 1).

Figure 6B:
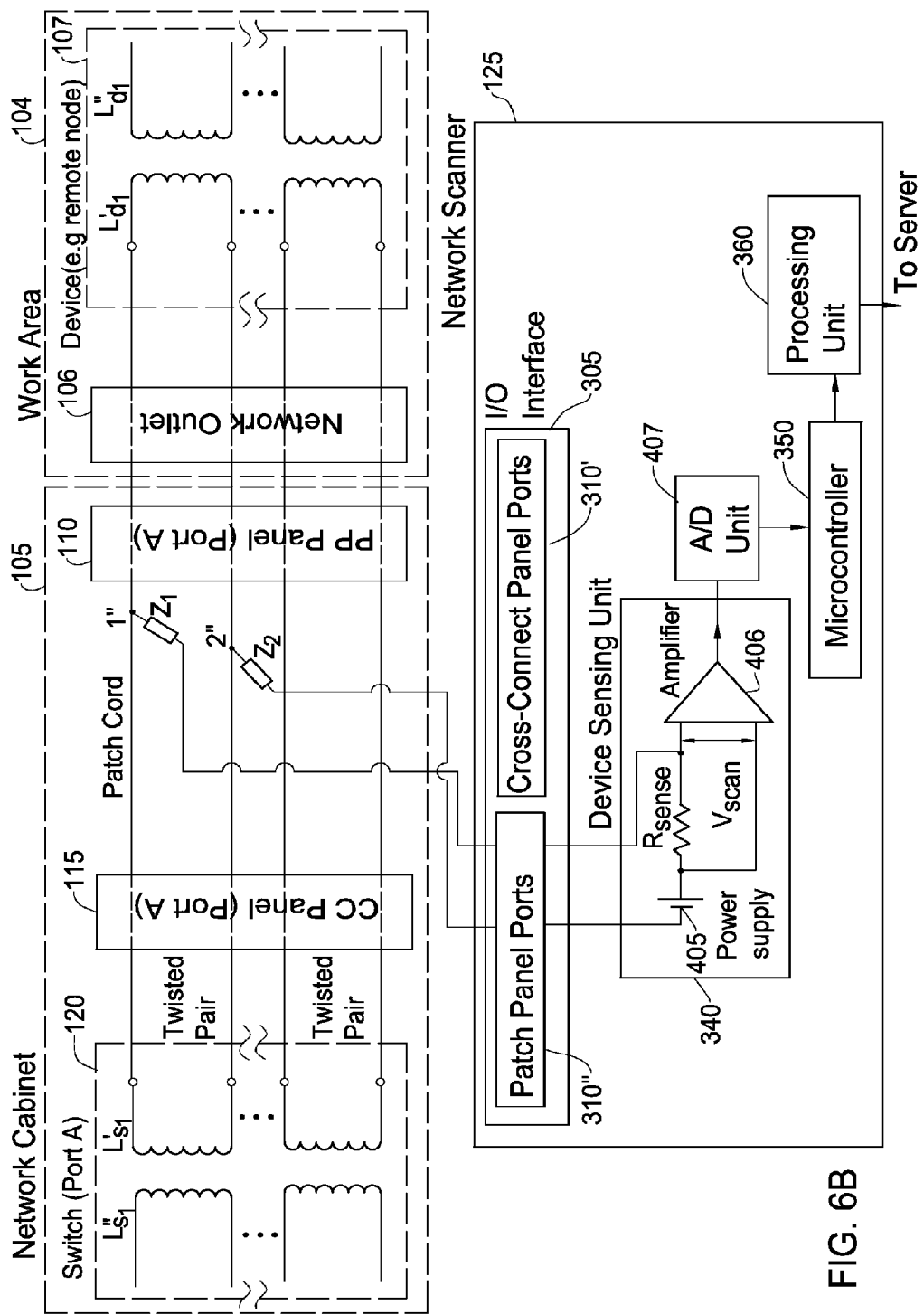
FIG. 6B is a sample illustration of a remote node detecting scheme, which refers to an inductance scan-mode from a remote node, according to an embodiment of the present invention.

FIG. 6B is a sample illustration of a remote node 107 detecting scheme, which refers to an inductance scan-mode from a remote node, according to an embodiment of the present invention. According to this embodiment, a remote node 107 is presented, for example, as a set of inducting components, such as inductors $L_{d1}'$ and $L_{d1}'$. $Z_1$ and $Z_2$ impedances are connected to terminals 1" and 2", respectively, of patch panel 110.

It should be noted that this embodiment of the present invention, is similar to the embodiment of FIG. 6A. The difference is that according to the embodiment of FIG. 6B, the network scanner 125 determines whether a specific network element, such as remote node 107, is physically connected to patch panel 110.

According to an embodiment of the present invention, device sensing unit 340 of network scanner 125 comprises a power supply 405 for feeding an electrical circuit defined by: inductor $L_{d1}'$, impedances $Z_1$ and $Z_2$, and $R_{sense}$ resistor. $R_{sense}$ resistor is connected to amplifier 406 for enabling amplifying voltage $V_{scan}$ on said $R_{sense}$ resistor. In turn, the output analog signal, provided from said amplifier 406, is conveyed into microcontroller 350 for analyzing it. Then, according to a voltage level of the amplified output signal, microcontroller 350 can determine whether said remote node 107 is connected to patch panel 110. For this, the above voltage level of the amplified output signal is compared by means of microcontroller 350 with a predefined reference voltage level. Then, the result of said comparison is processed, analyzed (either by microcontroller 350 and/or processing unit 360) and conveyed to server 135 (FIG. 1).

Figure 7A:
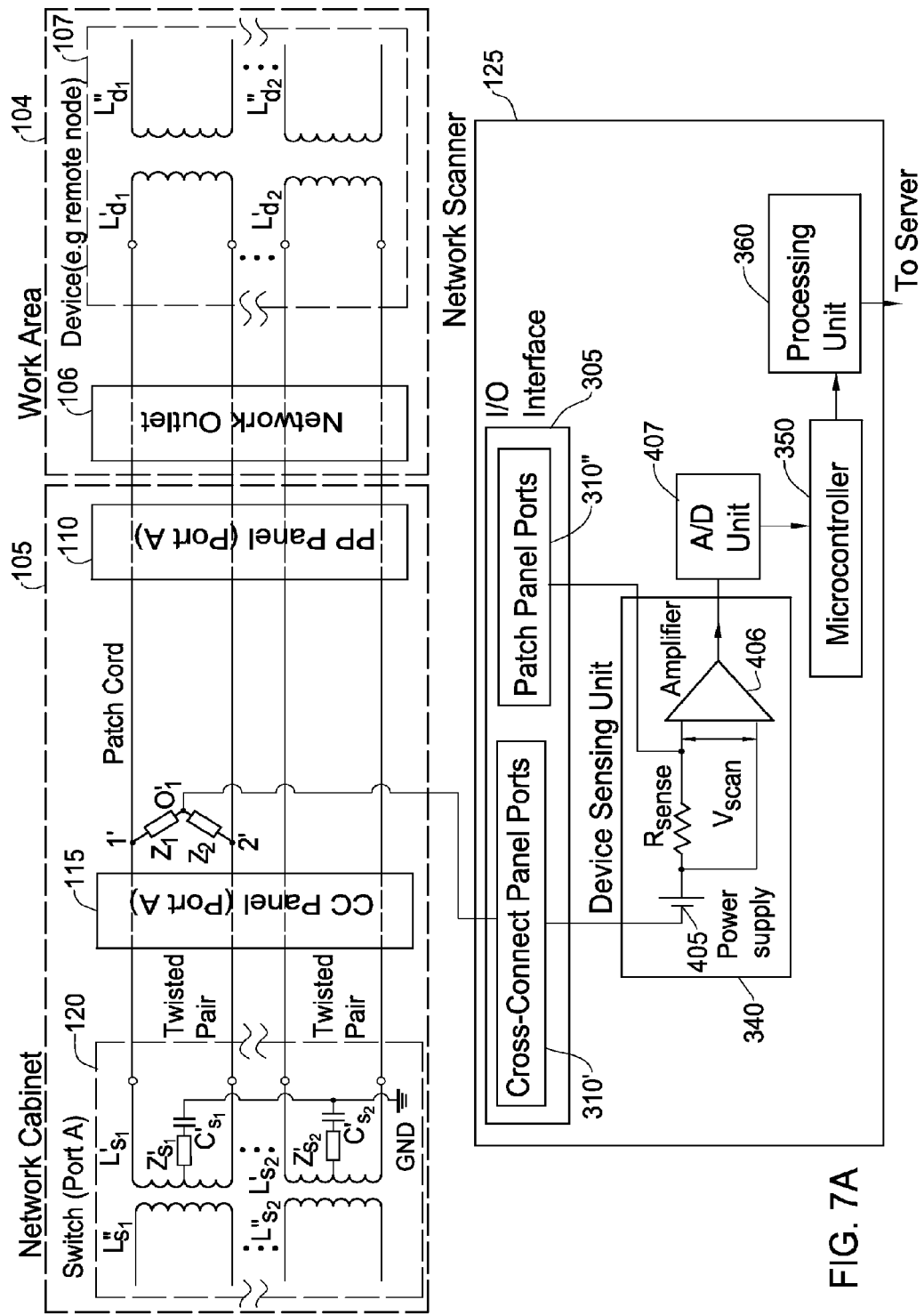
FIG. 7A is a sample illustration of a network switch detecting scheme, which refers to a capacitance scan-mode from a network switch, according to an embodiment of the present invention.

FIG. 7A is a sample illustration of a network switch 120 detecting scheme, which refers to a capacitance scan-mode from a network switch, according to an embodiment of the present invention. According to this embodiment, each port (such as port "A") of network switch 120 can be presented, for example, as a set of impedance components $Z_{s1}'$, $Z_{s2}''$, etc. (e.g., resistors and, optionally, inductors and the like) connected to corresponding capacitors $C_{s1}'$, $C_{s2}'$, etc., as generally presented in FIG. 7A. In addition, $Z_1$ and $Z_2$ impedances are connected to terminals 1' and 2', respectively, of cross-connect panel 115.

According to this embodiment of the present invention, device sensing unit 340 of network scanner 125 comprises a power supply 405 for feeding an electrical circuit defined by: inductor $L_{s1}'$, switch impedance $Z_{s1}'$, impedances $Z_1$ and $Z_2$, switch capacitor $C_{s1}'$, which are shorted or connected to the ground (GND), and by $R_{sense}$ resistor, which in turn, is connected to amplifier 406 for enabling amplifying voltage $V_{scan}$ on said $R_{sense}$ resistor. It should be noted that terminal $r_1$ of said $R_{sense}$ resistor is connected to switch $s_1$, which in turn is connected to the ground (GND). Switch $s_1$ may be closed and opened (switched ON and switched OFF) for enabling charging and discharging capacitor $C_{s1}'$ of network switch 120. Junction $O_1'$ of the interconnection of said impedances $Z_1$ and $Z_2$ is connected to amplifier 406, which can be provided, for example, within cross-connect panel 115. The amplifier amplifies the $V_{scan}$ voltage signal, which is conveyed into its input terminals, and then outputs a corresponding amplified signal into A/D unit 407 to be further provided into microcontroller 350 of said cross-connect panel 115. Then, according to a voltage level of the amplified output signal, microcontroller 350 (and/or processing unit 360) can determine whether switch 120 is physically connected to cross-connect panel 115.

Figure 7B:
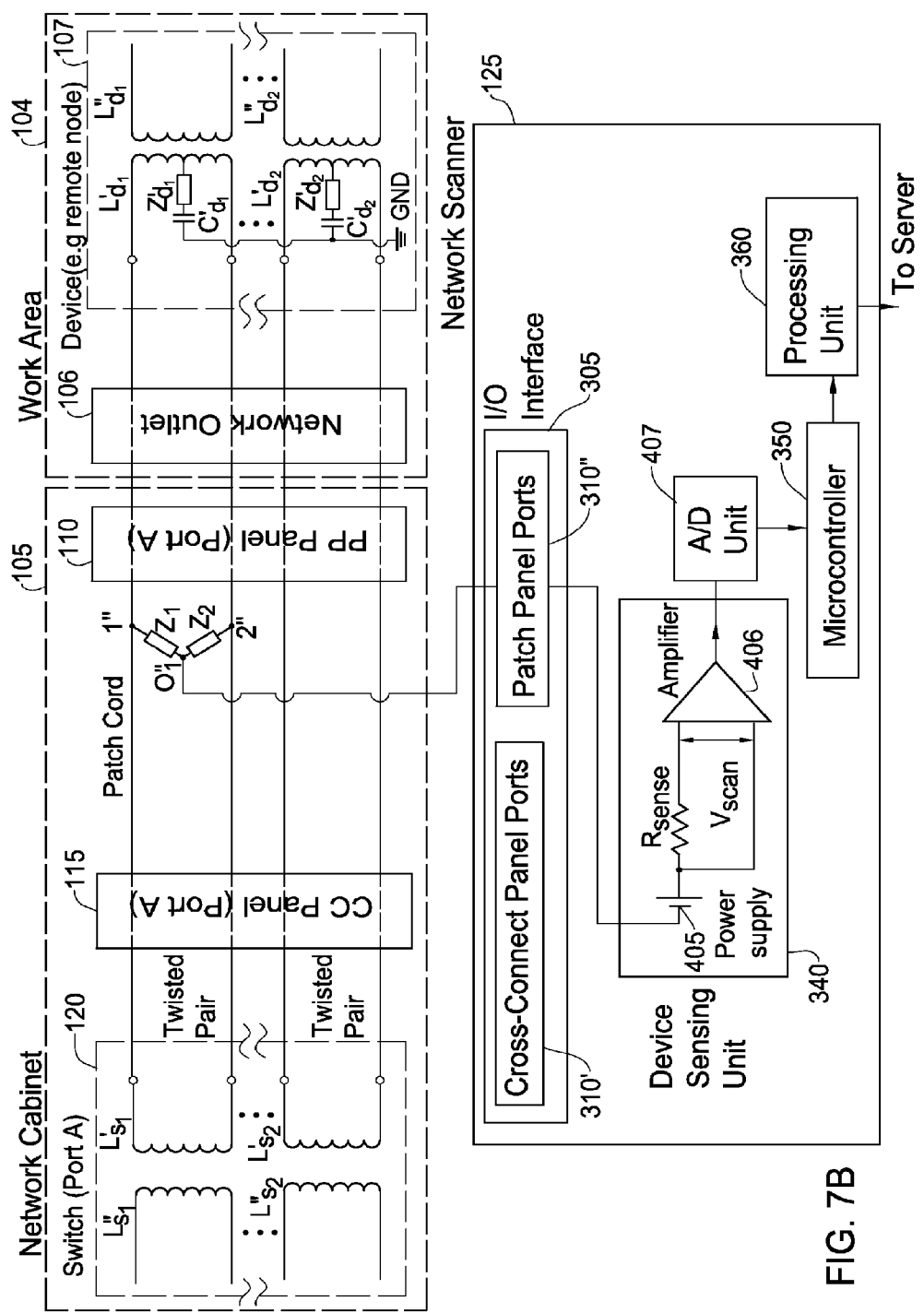
FIG. 7B is a sample illustration of a remote node detecting scheme, which refers to a capacitance scan-mode from a remote node, according to an embodiment of the present invention.

FIG. 7B is a sample illustration of a remote node 107 detecting scheme, which refers to a capacitance scan-mode from a remote node, according to an embodiment of the present invention. According to this embodiment, remote node 107 can be presented, for example, as a set of impedance components $Z_{d1}'$, $Z_{d2}''$, etc. (e.g., resistors and, optionally, inductors and the like) connected to corresponding capacitors $C_{d1}'$, $C_{d2}'$, etc., as generally presented in FIG. 7B. In addition, $Z_1$ and $Z_2$ impedances are connected to terminals 1" and 2", respectively, of patch panel 110.

According to this embodiment of the present invention, device sensing unit 340 of network scanner 125 comprises a power supply 405 for feeding an electrical circuit defined by: inductor Ld1', remote node impedance Zd1', impedances Z1 and Z2, remote node capacitor Cd1', which are shorted or connected to the ground (GND), and Rsense resistor, which in turn, is connected to amplifier 406 for enabling amplifying voltage $V_{scan}$ on said $R_{sense}$ resistor. It should be noted that terminal r1 of said $R_{sense}$ resistor is connected to switch s1, which in turn is connected to the ground (GND). Switch s1 may be closed and opened (switched ON and switched OFF) for enabling charging and discharging capacitor $C_{d1}'$ of remote node 107. Junction $O_1''$ of the interconnection of said impedances $Z_1$ and $Z_2$ is connected to amplifier 406, which can be provided, for example, within patch panel 110. Amplifier 406 amplifies the $V_{scan}$ voltage signal, which is conveyed into its input terminals, and then outputs a corresponding amplified signal into A/D unit 407 to be further provided into microcontroller 350 of said network scanner 125. Then, according to a voltage level of the amplified output signal, microcontroller 350 (and/or processing unit 360) can determine whether remote node 107 is physically connected to patch panel 110.

FIG. 8A is a schematic illustration of a patch cord detecting scheme, which refers to a patch cord scan-mode, while using fiber optics (FO) cabling (FO infrastructure), according to an embodiment of the present invention. According to this embodiment, both CC and PP panels 115 and 110, respectively, are provided with corresponding conventional fiber optics ports (such as fiber optics port A), thereby giving rise to CC and PP fiber optics panels. Further, the patch cord cable comprises one or more fiber optics wires and, optionally, one or more copper wires for conveying data/signals.

It should be noted that said CC and PP fiber optics panels can further comprise additional hardware and/or software units/components for enabling the patch cord detecting scheme according to this embodiment.

FIGS. 8B and 8C are schematic illustrations of a port detecting scheme, referred as a port detection scan mode, enabling detecting a connection of a FO cable (or any other type of a cable that comprises at least two terminals/ends) to at least one port of CC fiber optics panel 115 and PP fiber optics panel 110, respectively, while using fiber optics cabling, according to another embodiment of the present invention. It should be note that the FO cable, according to this embodiment of the present invention, is a cable that comprises one or more fiber optics wires and, optionally, one or more copper wires for conveying data/signals, and it is similar to the fiber optics patch cord cable of FIG. 8A. According to this embodiment, the device to be connected to said CC fiber optics panel 115 and PP fiber optics panel 110 by means of said fiber cable can be switch 120 (FIG. 1), another CC or PP fiber optics panel, or any other node (either remote or approximate node), such as outlet 106 (FIG. 1). Further, either CC fiber optics panel 115 or PP fiber optics panel 110 comprises impedances $Z_7$ and $Z_8$, respectively, as depicted in FIGS. 8B and 8C. By connecting each of said impedances $Z_7$ and $Z_8$, it is detected whether port A (of either CC fiber optics panel or PP fiber optics panel, respectively) is connected to a FO cable. It should be noted that according to this embodiment of the present invention, the detection of connecting the above FO cable to port A (by the first terminal of said FO cable) occurs regardless whether said FO cable is further connected (by the second terminal of said FO cable) to any device, such as switch 120 (FIG. 1), another panel 115 or 120, remote node/device 107 (FIG. 1), outlet 106 (FIG. 1), and the like.

It should be noted that impedances $Z_7$ and $Z_8$ can be connected either internally and/or externally to the CC and PP panels, respectively. Also, connecting or disconnecting said impedances $Z_7$ and $Z_8$ can be made by providing one or more corresponding switches (not shown), such as conventional mechanical switches, electrical switches, optical switches, or any other types of switches.

In addition, similarly to FIG. 8A, it should be noted that said CC and PP fiber optics panels can further comprise additional hardware and/or software units/components for enabling the port detecting scheme according to this embodiment.

Further, according to another embodiment of the present invention, while operating in a port detecting scan mode, a connection of a copper cable (instead of the above FO cable) to a port (e.g., port A) of either CC or PP panel can be also detected.

Figure 9A:
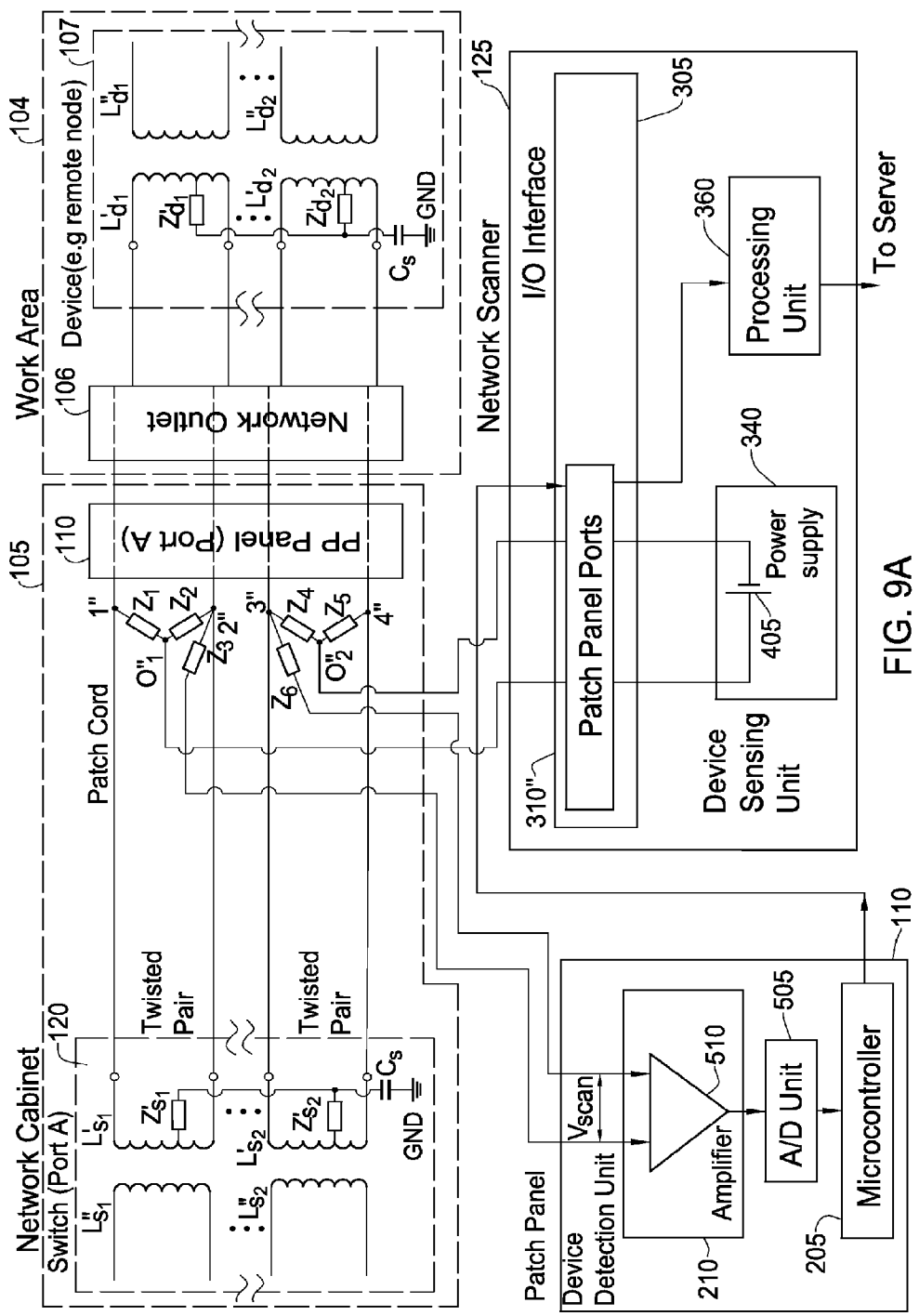
FIG. 9A is a schematic illustration of a detecting scheme, while interconnecting the patch panel substantially directly with network switch 120, according to an embodiment of the present invention.

FIG. 9A is a schematic illustration of a detecting scheme, while interconnecting patch panel 110 substantially directly with network switch 120, according to an embodiment of the present invention. According to this embodiment, CC panel 115 (FIG. 1) is not provided, and PP panel 110 is interconnected substantially directly with network switch 120 (or with any other device). Thus, this embodiment can be used both as network switch 120 and/or remote node 107 detecting scheme, which refers to an impedance scan-mode (similarly to FIGS. 5A and 5B, respectively). It should be noted that this embodiment can also refer to inductance and capacitance scan modes, when providing network switch 120 and/or remote node 107, as they are depicted in FIGS. 7A and 7B (as inductors and capacitors, respectively).

Figure 9B:
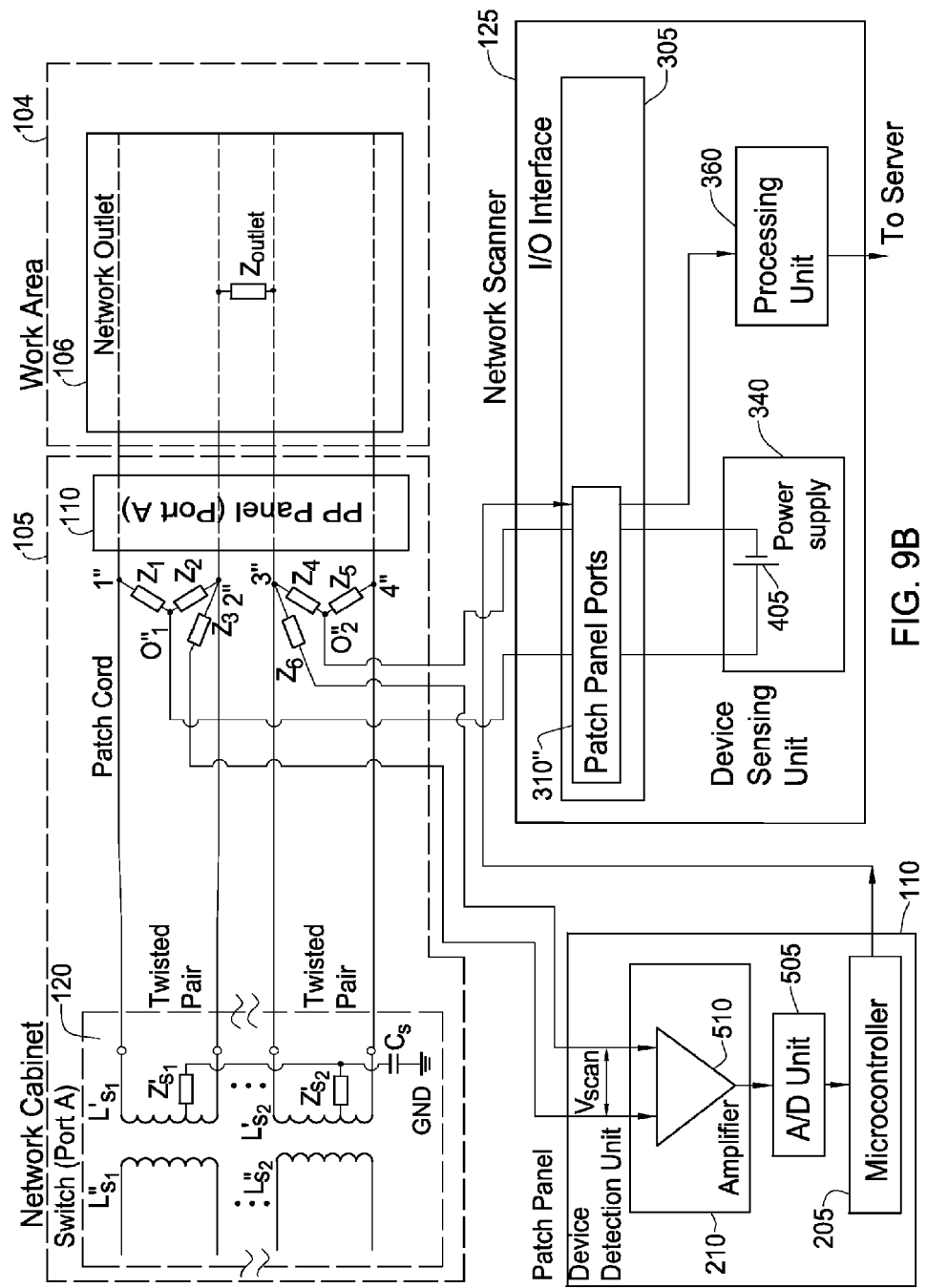
FIG. 9B is a schematic illustration of a detecting scheme, while interconnecting the patch panel substantially directly with the network switch, according to another embodiment of the present invention.

FIG. 9B is a schematic illustration of a detecting scheme, while interconnecting patch panel 110 substantially directly with network switch 120, according to another embodiment of the present invention. According to this embodiment, CC panel 115 (FIG. 1) is not provided, and PP panel 110 is interconnected substantially directly with network switch 120 (or with any other device). Thus, similarly to FIG. 9A, this embodiment can be used both as network switch 120 and/or network outlet 106 detecting scheme, which refers to an impedance scan-mode. It should be noted that this embodiment can also refer to inductance and capacitance scan modes, when providing network switch 120, as it is depicted in FIGS. 7A and 7B (as inductors and capacitors, respectively).

Figure 9C:
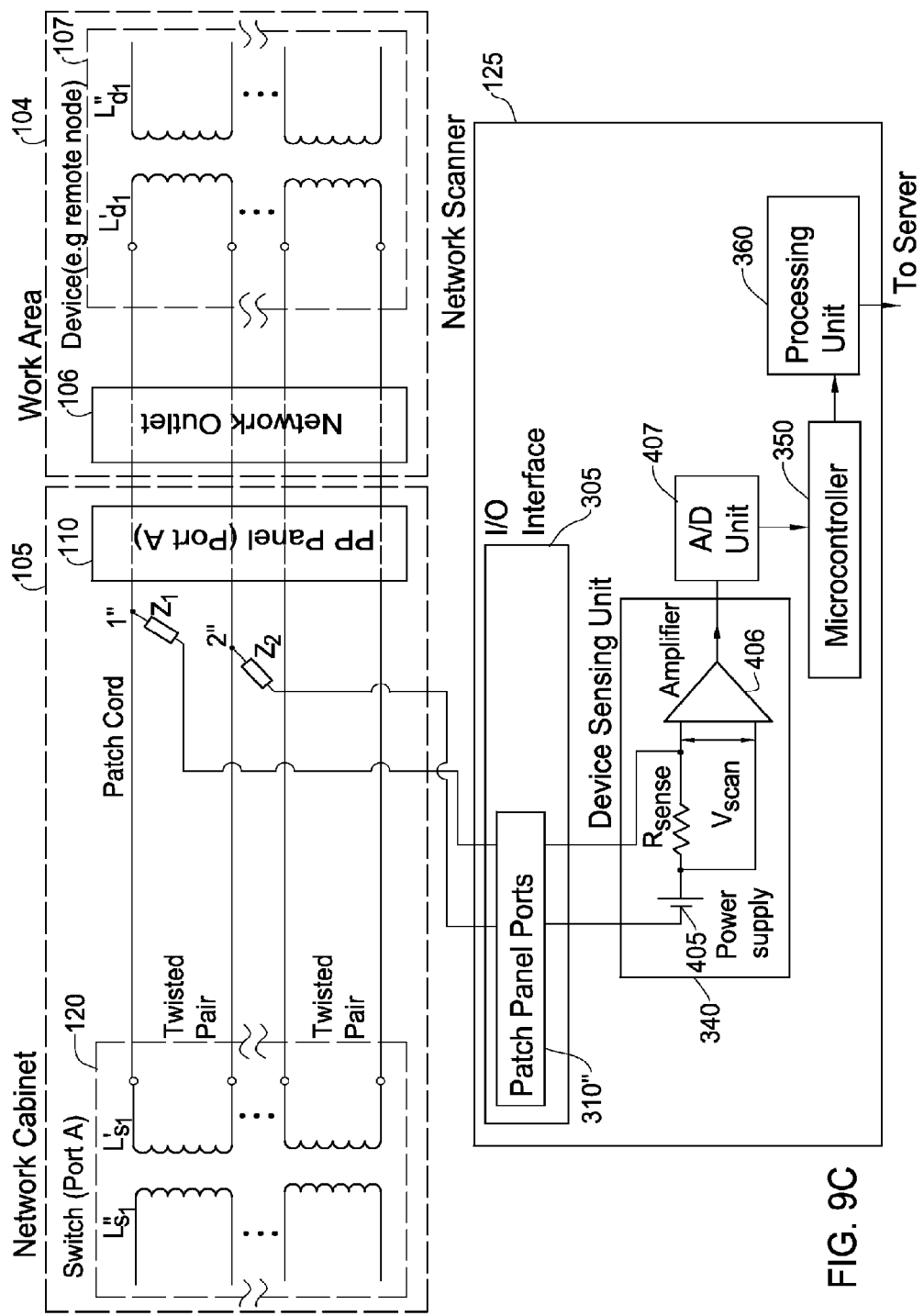
FIGS. 9C and 9D are schematic illustrations of a detecting scheme, while interconnecting the patch panel substantially directly with the network switch, according to still another embodiment of the present invention.
Figure 9D:
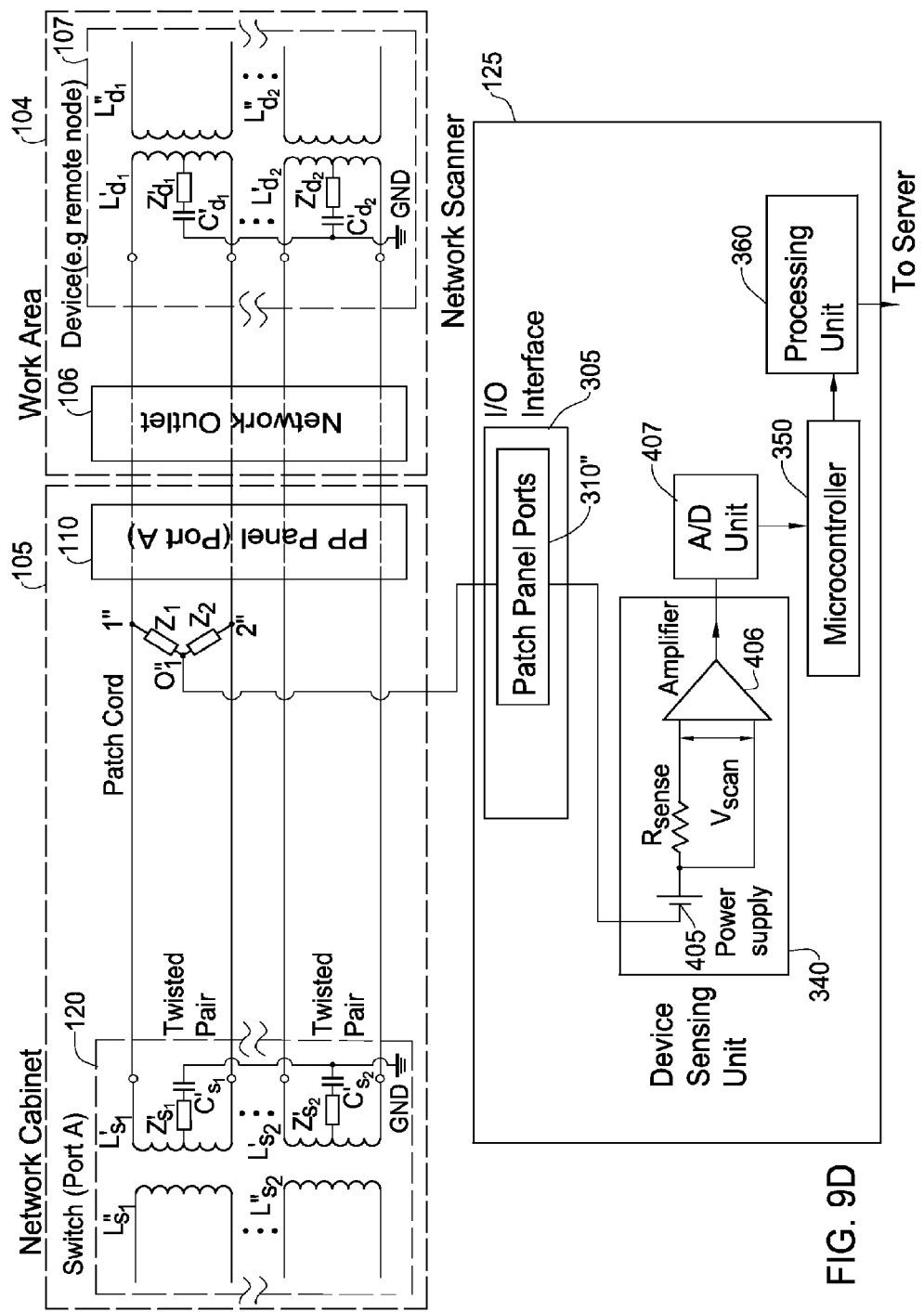

FIGS. 9C and 9D are schematic illustrations of a detecting scheme, while interconnecting patch panel 110 substantially directly with network switch 120, according to still another embodiment of the present invention. Similarly, to FIGS. 9A and 9B, CC panel 115 (FIG. 1) is not provided, and PP panel 110 is interconnected substantially directly with network switch 120 (or with any other device). Thus, this embodiment also can be used both as network switch 120 and/or remote node 107 detecting scheme, being referred to any one of the following or any combination thereof, similarly to embodiments of FIGS. 9A and 9B: a) an impedance scan-mode; b) an inductance scan-mode; and c) a capacitance scan-mode.

It should be noted that according to all embodiments of FIGS. 9A to 9D, a single panel, either CC or PP panel, is used. Thus, according to another embodiment of the present invention, the CC panel 115 can be physically located instead of the PP panel 110, thereby eliminating the need in providing said PP panel 110. Also, it should be noted that one or more impedances (e.g., $Z_1$ to $Z_8$) mentioned in this patent application can be one or more of the following or any combination thereof: a) provided (integrated) within one or more panels (e.g., PP and/or CC panels); and b) connected to said one or more panels externally. Further, it should be noted that the above impedances (e.g., $Z_1$ to $Z_8$) according to all embodiments of the present invention can either be connected (e.g., operatively coupled) to input and/or output ports of said panels, depending on the configuration of system 100 (FIG. 1) and depending on the physical location of said ports within each of said panels. Thus, referring for example to FIGS. 9A to 9D, the impedances $Z_1$ to $Z_6$ are depicted between switch 120 and PP panel 110 for example only.

Figure 10A:
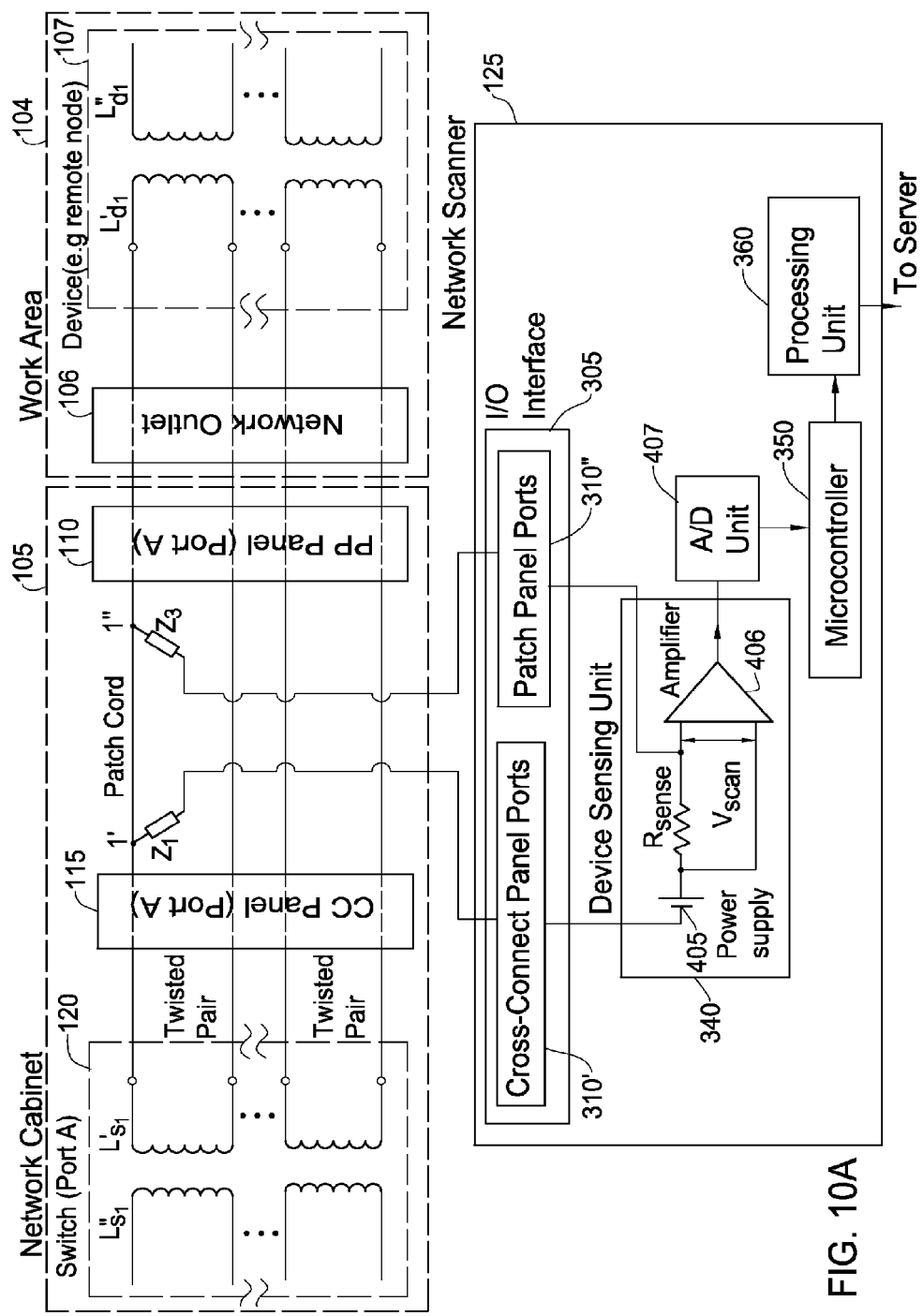
FIGS. 10A and 10B are schematic illustrations of a patch cord detecting scheme, which refers to a patch cord scan-mode, while using a single-ended mode/signaling, according to an embodiment of the present invention.
Figure 10B:
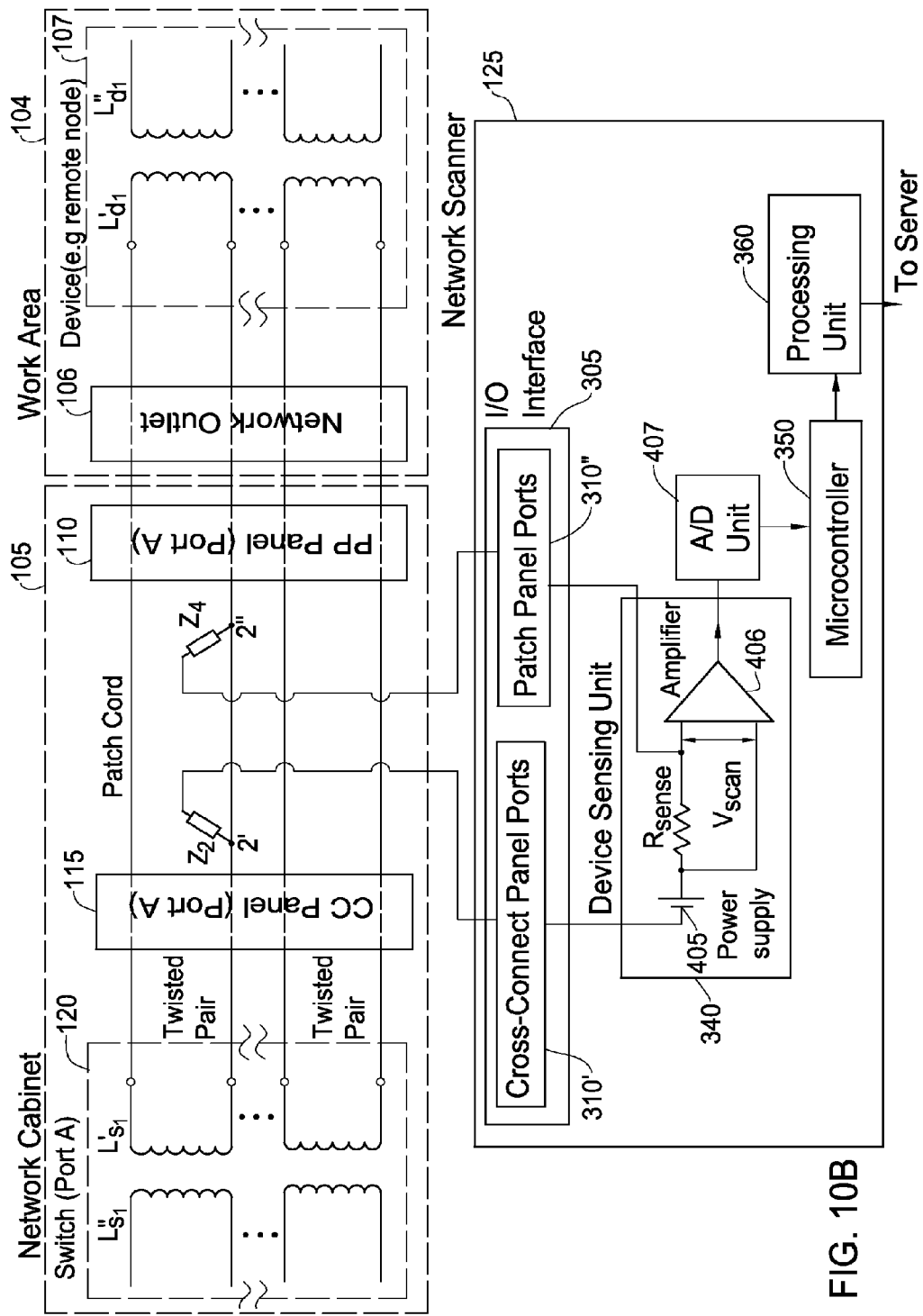

FIGS. 10A and 10B are schematic illustrations of a patch cord detecting scheme, which refers to a patch cord scan-mode, while using a single-ended mode/signaling, according to an embodiment of the present invention. According to this embodiment, the patch cord detection is performed by using impedances $Z_1$, $Z_3$ or impedances $Z_2$, $Z_4$, respectively, connected to a corresponding single wire, thereby operating in a single-ended mode.

It should be noted that embodiments of the present invention, depicted in FIGS. 4 to 9D are related to the differential mode/signaling, while the embodiments of the present invention depicted in FIGS. 10A and 10B are related to the single-ended mode/signaling.

It should be noted that as described above, numerous systems and structures are possible for connecting and monitoring different aspects of a cabling system 100 (FIG. 1). For example, a patch cord detecting scheme is depicted in FIGS. 4, 8A, 10A and 10B to monitor the connections or patches between cross-connect panel(s) 115 and patch panel(s) 110. In addition, network switch detecting schemes are depicted, for example, in FIGS. 5A, 6A, 7A, and 9A to 9D. Remote node detecting schemes are depicted, for example, in FIGS. 5B, 6B, 7B, and 9A to 9D. Outlet detecting schemes are depicted, for example, in FIGS. 5C and 8C. The port detecting scheme is depicted, for example, in FIGS. 8B and 8C. Each of these may be used as desired to monitor and detect various individual connections between network switch(es) 120 and cross-connect panel(s) 115 (e.g., FIG. 5A, 6A or 7A), patch panel(s) 110 and cross-connect panel(s) 115 (e.g., FIGS. 4, 8A, 10A and 10B), patch panel(s) 110 and remote outlet(s) 106 (e.g., FIG. 5C), patch panel(s) 110 and end device(s) 107 (e.g., FIGS. 5B, 6B, 7B, and 9A to 9D), and the like. By utilizing a system that incorporates one of each type of scheme, the portion of the data network 100 extending from the switch 120 to end device 107 may be monitored (and managed) to determine various connections and changes in connections between the elements of the data network (e.g., patch/cross-connect panels, devices, units, ports, etc.), and between said switches 120 and end devices 107. In other words, utilizing various schemes depicted for example (and not limited to), in FIGS. 4-10B, enables system 100 to monitor (and manage) connections between the elements of the data network. As such, system 100 can determine whether each cable terminal (connector) or cable segment/wire is connected or disconnected and whether any cable terminal or cable segment/wire has been recently connected or disconnected. As a result, a system incorporating such a monitoring (and managing) system is able to provide, substantially in real-time, specific details/characteristics regarding each connection and each element of the data network extending, for example, between said switch 120 and end device 107.

For example, as depicted in FIG. 1, a switch 120 is connected to a cross-connect panel 115, which is in turn connected to a patch panel 110, which is connected to a remote outlet 106 having an end device 107 connected thereto. If any of the individual connections are broken (terminated), either because a patch cord 111 is disconnected, or said end device 107 is unplugged from said remote outlet 106 or any other type of connection is otherwise disconnected, the scanner 125 determines such a change and determines a corresponding value of the relevant electrical characteristic (e.g., the change in a current and/or voltage level) over the electronic circuitry of either patch panel 110, cross-connect panel 115 and/or the circuitry of said scanner 125, through which the signals to and from the disconnected element (i.e., device, unit, etc.) are passed. Similarly, if a new connection is made, the scanner determines such a change and determines a corresponding value of the relevant electrical characteristic over the one or more electronic circuitries of system 100, through which signals to and from the newly connected element pass. It should be noted that in either case, whether a new connection is made or any element/device (panel, cable, port, etc.) is disconnected from system 100, that information may then be substantially immediately (substantially in real-time) communicated to server 135 (FIG. 1) and to the corresponding personnel.

While some embodiments of the invention have been described by way of illustration, it will be apparent that the invention can be put into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A method, comprising:
in a cable connection, which comprises a first section comprising one or more wire pairs and having a first end that is potentially connected to a first endpoint, and which further comprises a second section comprising the one or more wire pairs and having a second end that is potentially connected to a second endpoint, applying a test signal to a single wire pair selected from among the wire pairs via one or more signal-injection impedance-components that are connected to the single wire pair at a mid-point between the first and second sections;
sensing the test signal on the single wire pair via one or more signal-sensing impedance-components that are connected to the single wire pair at the mid-point between the first and second sections; and
based on the sensed test signal, determining whether or not the first section is connected to the second section at the mid-point.

2. The method according to claim 1, wherein determining whether or not the first section is connected to the second section comprises determining whether the first section is patched by a patch cord to the second section.

3. The method according to claim 1, wherein applying and sensing the test signal comprise interfacing to the cable connection while retaining Direct-Current (DC) connectivity between the first and second ends of the wire pair.

4. The method according to claim 1, wherein applying and sensing the test signal comprise interfacing to at least one of a patch panel and a cross-connect panel traversed by the cable connection.

5. The method according to claim 1, wherein sensing the test signal comprises measuring, for at least one of the first and second endpoints, one of:
an impedance characteristic;
an inductance characteristic; and
a capacitance characteristic.

6. A method, comprising:
connecting a network scanner to a cable connection, which comprises a first section comprising one or more wire pairs and having a first end that is potentially connected to a first endpoint, and which further comprises a second section comprising the one or more wire pairs and having a second end that is potentially connected to a second endpoint, wherein the network scanner is connected to the cable connection at a mid-point between the first and second sections by one or more signal-injection impedance-components and one or more signal-sensing impedance-components, while retaining Direct-Current (DC) connectivity between the first and second ends of the wire pairs;
using the network scanner, applying a test signal to the cable connection via the signal-injection impedance-components at the mid-point between the first and second sections, and sensing the test signal on the cable connection via the signal-sensing impedance-components at the mid-point between the first and second sections; and
based on the sensed test signal, distinguishing whether none of the endpoints, only one of the endpoints, or both of the endpoints, are connected to the cable connection.

7. The method according to claim 6, wherein the cable connection comprises multiple wire pairs, wherein applying the test signal comprises injecting the test signal to a first wire pair, and wherein sensing the test signal comprises measuring the test signal on a second wire pair that is different from the first wire pair.

8. The method according to claim 6, wherein the cable connection comprises multiple wire pairs, and wherein applying and sensing the test signal comprise injecting and measuring the test signal on a same wire pair selected from among the multiple wire pairs.

9. Apparatus, comprising:
one or more signal-injection impedance-components and one or more signal-sensing impedance-components, configured for connecting to a mid-point between first and second sections of a cable connection, wherein the first section comprises one or more wire pairs and has a first end that is potentially connected to a first endpoint, and wherein the second section comprises the one or more wire pairs and has a second end that is potentially connected to a second endpoint; and
a scanner, which is configured to apply, via the signal-injection impedance-components at the mid-point between the first and second sections, a test signal to a single wire pair selected from among the wire pairs, to sense the test signal on the single wire pair via the signal-sensing impedance-components at the mid-point between the first and second sections, and, based on the sensed test signal, to determine whether or not the first section is connected to the second section at the mid-point.

10. The apparatus according to claim 9, wherein the scanner is configured to determine whether the first section is patched by a patch cord to the second section.

11. The apparatus according to claim 9, wherein the interface is configured to connect to the cable connection while retaining Direct-Current (DC) connectivity between the first and second ends of the wire pair.

12. The apparatus according to claim 9, wherein the interface is configured to connect to at least one of a patch panel and a cross-connect panel traversed by the cable connection.

13. The apparatus according to claim 9, wherein the scanner is configured to sense the test signal by measuring, for at least one of the first and second endpoints, one of:

an impedance characteristic;
an inductance characteristic; and
a capacitance characteristic.

14. Apparatus, comprising:
one or more signal-injection impedance-components and one or more signal-sensing impedance-components, configured for connecting to a mid-point between first and second sections of a cable connection, wherein the first section comprises one or more wire pairs and has a first end that is potentially connected to a first endpoint, and wherein the second section comprises the one or more wire pairs and has a second end that is potentially connected to a second endpoint, while retaining Direct-Current (DC) connectivity between the first and second ends of the wire pairs; and
a scanner, which is configured to apply a test signal to the cable connection via the signal-injection impedance-components at the mid-point between the first and second sections, to sense the test signal on the cable connection via the signal-sensing impedance-components at the mid-point between the first and second sections, and, based on the sensed test signal, to distinguish whether none of the endpoints, only one of the endpoints, or both of the endpoints, are connected to the cable connection.

15. The apparatus according to claim 14, wherein the cable connection comprises multiple wire pairs, and wherein the interface is configured to apply the test signal to a first wire pair, and to sense the test signal on a second wire pair that is different from the first wire pair.

16. The apparatus according to claim 14, wherein the cable connection comprises multiple wire pairs, and wherein the interface is configured to apply and sense the test signal on a same wire pair selected from among the multiple wire pairs.

* * * * *